(12) United States Patent
Inoue

(10) Patent No.: US 11,563,913 B2
(45) Date of Patent: Jan. 24, 2023

(54) SOLID-STATE IMAGING ELEMENT AND IMAGING DEVICE

(71) Applicant: SONY SEMICONDUCTOR SOLUTIONS CORPORATION, Kanagawa (JP)

(72) Inventor: Kota Inoue, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/416,401

(22) PCT Filed: Nov. 11, 2019

(86) PCT No.: PCT/JP2019/044087
§ 371 (c)(1),
(2) Date: Jun. 18, 2021

(87) PCT Pub. No.: WO2020/137198
PCT Pub. Date: Jul. 2, 2020

(65) Prior Publication Data
US 2021/0392288 A1 Dec. 16, 2021

(30) Foreign Application Priority Data
Dec. 26, 2018 (JP) .............................. JP2018-242059

(51) Int. Cl.
*H04N 5/3745* (2011.01)
(52) U.S. Cl.
CPC ..... *H04N 5/37455* (2013.01); *H04N 5/37452* (2013.01)
(58) Field of Classification Search
CPC ........... H04N 5/37455; H04N 5/37452; H04N 5/37457; H04N 5/347; H04N 5/3355;
(Continued)

(56) References Cited

U.S. PATENT DOCUMENTS

| 9,674,469 B2 * | 6/2017 | Moriwaka ............... H04N 5/369 |
| 2009/0128678 A1 * | 5/2009 | Kitami ................... H04N 5/347 |
| | | 348/308 |
| 2012/0268630 A1 * | 10/2012 | Ueda ....................... H04N 9/04 |
| | | 348/E9.002 |

FOREIGN PATENT DOCUMENTS

| CN | 102752558 A | 10/2012 |
| JP | 2012-227695 A | 11/2012 |

(Continued)

OTHER PUBLICATIONS

International Search Report and Written Opinion of PCT Application No. PCT/JP2019/044087, dated Feb. 10, 2020, 08 pages of ISRWO.

*Primary Examiner* — Lin Ye
*Assistant Examiner* — Chan T Nguyen
(74) *Attorney, Agent, or Firm* — Chip Law Group

(57) ABSTRACT

In a solid-state imaging element that performs AD conversion for each pixel, image quality degradation when resolution is lowered is suppressed without wastefully consuming power.

The solid-state imaging element includes a plurality of pixels. Each of the plurality of pixels is provided with a comparison unit, an addition circuit, and a data storage unit. The comparison unit generates a difference signal obtained by amplifying a difference between an analog pixel signal to which a predetermined coordinate is assigned and a predetermined reference signal. The addition circuit generates an addition signal by performing analog addition of the difference signal and a difference signal regarding another coordinate adjacent to the predetermined coordinate. The data storage unit holds a digital signal indicating a time when an output signal of the comparison unit corresponding to the addition signal is inverted.

11 Claims, 24 Drawing Sheets

(58) Field of Classification Search
CPC ....... H04N 5/3745; H04N 5/378; H03M 1/12; H03M 1/56; H03M 1/00–645
USPC .................................. 341/155–172; 348/308
See application file for complete search history.

(56) References Cited

FOREIGN PATENT DOCUMENTS

| | | |
|---|---|---|
| JP | 2014-187423 A | 10/2014 |
| JP | 2016-140109 A | 8/2016 |
| WO | 2016/136448 A | 9/2016 |

* cited by examiner

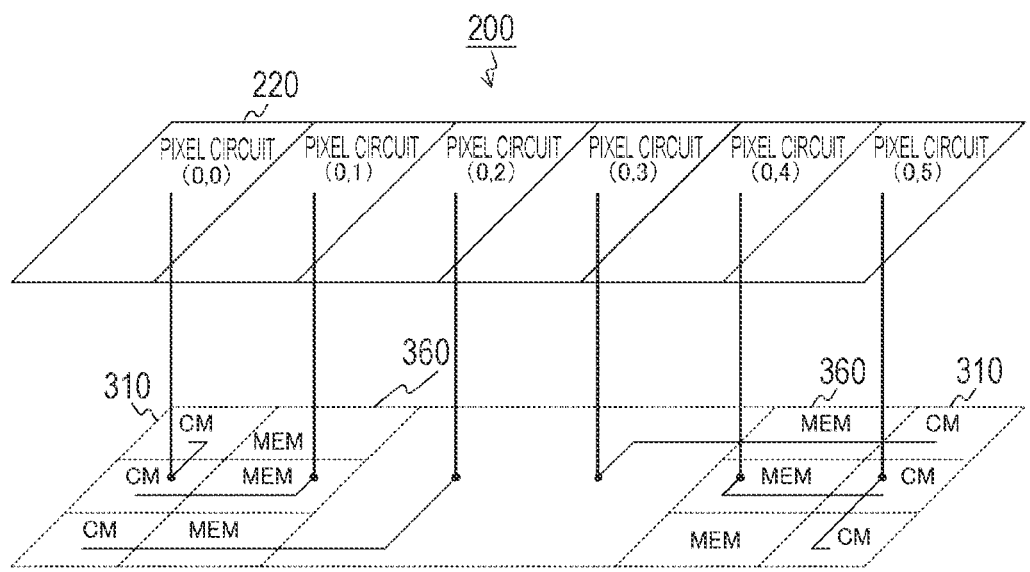

FIG. 14

|  | ZEROTH COLUMN | FIRST COLUMN | SECOND COLUMN | THIRD COLUMN | FOURTH COLUMN | FIFTH COLUMN | |
|---|---|---|---|---|---|---|---|
| ZEROTH ROW | PIXEL (R) | PIXEL (Gr) | PIXEL (R) | PIXEL (Gr) | PIXEL (R) | PIXEL (Gr) | ... |
| FIRST ROW | PIXEL (Gb) | PIXEL (B) | PIXEL (Gb) | PIXEL (B) | PIXEL (Gb) | PIXEL (B) | |
| SECOND ROW | PIXEL (R) | PIXEL (Gr) | PIXEL (R) | PIXEL (Gr) | PIXEL (R) | PIXEL (Gr) | |
| THIRD ROW | PIXEL (Gb) | PIXEL (B) | PIXEL (Gb) | PIXEL (B) | PIXEL (Gb) | PIXEL (B) | |

FIG. 15

|  | ZEROTH COLUMN | FIRST COLUMN | SECOND COLUMN | THIRD COLUMN | FOURTH COLUMN | FIFTH COLUMN | |
|---|---|---|---|---|---|---|---|
| ZEROTH ROW | PIXEL (R) | PIXEL (Gr) | PIXEL (R) | PIXEL (Gr) | PIXEL (R) | PIXEL (Gr) | ... |
| FIRST ROW | PIXEL (Gb) | PIXEL (B) | PIXEL (Gb) | PIXEL (B) | PIXEL (Gb) | PIXEL (B) | |
| SECOND ROW | PIXEL (R) | PIXEL (Gr) | PIXEL (R) | PIXEL (Gr) | PIXEL (R) | PIXEL (Gr) | |
| THIRD ROW | PIXEL (Gb) | PIXEL (B) | PIXEL (Gb) | PIXEL (B) | PIXEL (Gb) | PIXEL (B) | |
| FORTH ROW | PIXEL (R) | PIXEL (Gr) | PIXEL (R) | PIXEL (Gr) | PIXEL (R) | PIXEL (Gr) | |
| FIFTH ROW | PIXEL (Gb) | PIXEL (B) | PIXEL (Gb) | PIXEL (B) | PIXEL (Gb) | PIXEL (B) | |

| CONTROL LINE | MODE | | |
|---|---|---|---|
| | TWO-PIXEL ADDITION MODE | THREE-PIXEL ADDITION MODE | NON-ADDITION MODE |
| M1 | LOW LEVEL (ON) | HIGH LEVEL (OFF) | HIGH LEVEL (OFF) |
| M2 | HIGH LEVEL (OFF) | LOW LEVEL (ON) | HIGH LEVEL (OFF) |
| M3 | LOW LEVEL (ON) | LOW LEVEL (ON) | HIGH LEVEL (OFF) |

…

SOLID-STATE IMAGING ELEMENT AND IMAGING DEVICE

CROSS REFERENCE TO RELATED APPLICATIONS

This application is a U.S. National Phase of International Patent Application No. PCT/JP2019/044087 filed Nov. 11, 2019, which claims priority benefit of Japanese Patent Application No. JP 2018-242059 filed in the Japan Patent Office on Dec. 26, 2018. Each of the above-referenced applications is hereby incorporated herein by reference in its entirety.

TECHNICAL FIELD

The present technology relates to a solid-state imaging element and an imaging device. More specifically, the present invention relates to a solid-state imaging element and an imaging device that convert an analog signal into a digital signal.

BACKGROUND ART

In an imaging device or the like, a solid-state imaging element has conventionally been used that converts an analog signal into a digital signal for each pixel for the purpose of increasing the speed of Analog to Digital (AD) conversion. For example, a solid-state imaging element has been devised in which a pixel circuit that generates an analog pixel signal, a comparison unit that compares the pixel signal and a reference signal, and a data storage unit that holds a digital time code when a differential input circuit is inverted are arranged for each pixel (see, for example, Patent Document 1). The analog pixel signal is converted into the digital time code for each pixel by these comparison unit and data storage unit.

CITATION LIST

Patent Document

Patent Document 1: WO 2016/136448 A

SUMMARY OF THE INVENTION

Problems to be Solved by the Invention

Since AD conversion is performed for each pixel in the conventional technology described above, the speed of AD conversion is improved as compared with a case where AD conversion is performed for each column. However, in the solid-state imaging element described above, if resolution is lowered by thinning out pixel signals for the purpose of matching an output format with that required by an output destination device, image quality degrades as the number of pixels thinned out increases. On the other hand, if a method is used of lowering the resolution by addition of digital signals without thinning out the pixel signals, degradation of the image quality can be suppressed, but power consumption increases as compared with the case of thinning out, and the power consumption cannot be sufficiently suppressed, which is not preferable. As described above, in the solid-state imaging element described above, there is a problem that it is difficult to simultaneously suppress the degradation of the image quality of the image and the power consumption when the resolution is lowered.

The present technology has been created in view of such a situation, and it is an object to suppress the degradation of the image quality when lowering the resolution without wastefully consuming power in a solid-state imaging element that performs AD conversion for each pixel.

Solutions to Problems

The present technology has been made to solve the problem described above, and a first aspect thereof is a solid-state imaging element including a plurality of pixels each provided with: a comparison unit that generates a difference signal obtained by amplifying a difference between an analog pixel signal to which a predetermined coordinate is assigned and a predetermined reference signal; an addition circuit that generates an addition signal by performing analog addition of the difference signal and a difference signal regarding another coordinate adjacent to the predetermined coordinate; and a data storage unit that holds a digital signal indicating a time when a signal corresponding to the addition signal is inverted. As a result, there is an effect that the difference signal obtained by amplifying the difference between the pixel signal and the reference signal is subjected to the analog addition.

Furthermore, in the first aspect, the comparison unit may generate and output the difference signal to a predetermined internal node, and the addition circuit may perform analog addition of the difference signal by connection of the internal node of each of pixels to be added among the plurality of pixels. As a result, there is an effect that the difference signal is subjected to the analog addition by connection of the internal nodes.

Furthermore, in the first aspect, the pixels to be added may be a pair of pixels, and the addition circuit may include a connection transistor that opens and closes a path between the internal node of one of the pair of pixels and the internal node of another. As a result, there is an effect that the difference signals of the pair of pixels is subjected to analog addition.

Furthermore, in the first aspect, the pixels to be added may be a first pixel, a second pixel, and a third pixel, the addition circuit of the second pixel may include a first pixel side connection transistor that opens and closes a path between the first pixel and the internal node of the second pixel, and a third pixel side connection transistor that opens and closes a path between the internal node of the second pixel and the third pixel. As a result, there is an effect that the difference signal of three pixels is subjected to analog addition.

Furthermore, in the first aspect, in a case where a two-pixel addition mode for adding two pixels together is set, one of the first pixel side connection transistor or the third pixel side connection transistor may shift to an open state and another may shift to a closed state, and in a case where a three-pixel addition mode for adding three pixels together is set, both the first pixel side connection transistor and the third pixel side connection transistor may shift to the closed state. As a result, there is an effect that switching is performed to either of the addition of two pixels or the addition of three pixels.

Furthermore, in the first aspect, the addition circuit of each of the first pixel and the second pixel may include a second pixel side connection transistor that opens and closes a path between the internal node of the first pixel and the second pixel, and in a case where the two-pixel addition mode is set, the second pixel side connection transistor of one of the first pixel or the second pixel may shift to the open state and the second pixel-side connection transistor of another may shift to the closed state, and in a case where the three-pixel addition mode is set, the second pixel side connection transistor of both the first pixel and the second pixel may shift to the closed state. As a result, there is an effect that switching is performed to either of the addition of two pixels or the addition of three pixels.

Furthermore, in the first aspect, the plurality of pixels may be arranged in a two-dimensional lattice, and the addition circuit may perform analog addition of the difference signal of each of a predetermined number of pixels arranged in a predetermined direction among the plurality of pixels. As a result, there is an effect that the predetermined number of pixels arranged in the predetermined direction is subjected to the analog addition.

Furthermore, in the first aspect, each of the plurality of pixels may be provided with a repeater that transfers the digital signal, the repeater may be arranged in a vertical direction perpendicular to a predetermined horizontal direction, and the addition circuit may perform analog addition of the difference signal of each of the predetermined number of pixels arranged in the vertical direction. As a result, there is an effect that the predetermined number of pixels arranged in the horizontal direction is subjected to the analog addition.

Furthermore, in the first aspect, each of the plurality of pixels may be provided with a repeater that transfers the digital signal, the repeater may be arranged in a vertical direction perpendicular to a predetermined horizontal direction, and the addition circuit may perform analog addition of the difference signal of each of the predetermined number of pixels arranged in the horizontal direction among the plurality of pixels. As a result, there is an effect that the predetermined number of pixels arranged in the vertical direction is subjected to the analog addition.

Furthermore, in the first aspect, a part of the comparison unit may be arranged on a predetermined light receiving chip, and a rest of the comparison unit, the addition circuit, and the data storage unit may be arranged on a predetermined circuit chip. As a result, there is an effect that pixel addition is performed in the solid-state imaging element having a laminated structure.

Furthermore, a second aspect of the present technology is an imaging device including: a plurality of pixels each provided with a comparison unit that generates a difference signal obtained by amplifying a difference between an analog pixel signal to which a predetermined coordinate is assigned and a predetermined reference signal, an addition circuit that generates an addition signal by performing analog addition of the difference signal and a difference signal regarding another coordinate adjacent to the predetermined coordinate, and a data storage unit that holds a digital signal indicating a time when a signal corresponding to the addition signal is inverted; and a logic circuit that processes the digital signal. As a result, there is an effect that the analog signal corresponding to the difference signal subjected to the analog addition is converted into the digital signal.

BRIEF DESCRIPTION OF DRAWINGS

FIG. 6 is a perspective view illustrating an example of a connection relationship between a pixel circuit and a circuit in the cluster in the first embodiment of the present technology.

FIG. 7 is a diagram illustrating an example of a connection relationship between pixels in the first embodiment of the present technology.

FIG. 14 is a diagram illustrating an example of a connection relationship between pixels in a modification of the first embodiment of the present technology.

FIG. 15 is a diagram illustrating an example of a connection relationship between pixels in a second embodiment of the present technology.

FIG. 21 is a diagram illustrating an example of control for each mode in the third embodiment of the present technology.

MODE FOR CARRYING OUT THE INVENTION

Figure 1:
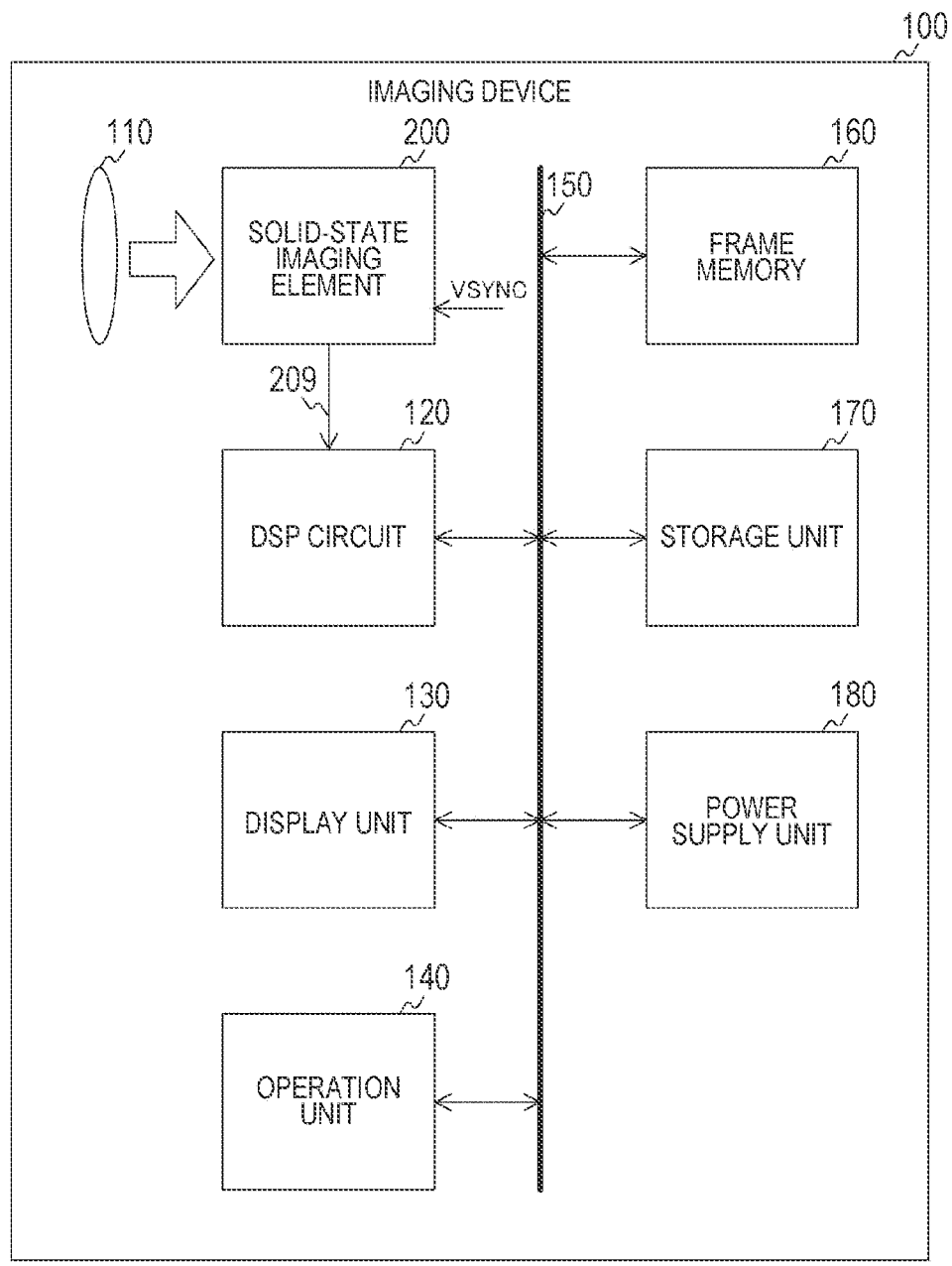
FIG. 1 is a block diagram illustrating a configuration example of an imaging device in a first embodiment of the present technology.

The following is a description of a mode for carrying out the present technology (the mode will be hereinafter referred to as the embodiment). The description will be made in the following order.
1. First embodiment (example of performing analog addition of difference signal)
2. Second embodiment (example of performing analog addition of difference signals of three pixels)
3. Third embodiment (example of performing analog addition of difference signals by switching number of pixels to be added together)
4. Fourth embodiment (scanning type)
5. Application example to mobile body 1. First Embodiment Configuration Example of Imaging Device FIG. 1 is a block diagram illustrating a configuration example of an imaging device 100 in a first embodiment of the present technology. The imaging device 100 is a device for capturing image data, and includes an optical unit 110, a solid-state imaging element 200, and a Digital Signal Processing (DSP) circuit 120. The imaging device 100 further includes a display unit 130, an operation unit 140, a bus 150, a frame memory 160, a storage unit 170, and a power supply unit 180. As the imaging device 100, for example, in addition to a digital camera such as a digital still camera, a smartphone or personal computer having an imaging function, an in-vehicle camera, or the like is assumed.

The optical unit 110 collects light from a subject and guides the light to the solid-state imaging element 200. The solid-state imaging element 200 generates the image data by photoelectric conversion in synchronization with a vertical synchronization signal VSYNC. Here, the vertical synchronization signal VSYNC is a periodic signal having a predetermined frequency indicating a timing of imaging. The solid-state imaging element 200 supplies the generated image data to the DSP circuit 120 via a signal line 209.

The DSP circuit 120 executes predetermined signal processing on the image data from the solid-state imaging element 200. The DSP circuit 120 outputs the image data after the processing to the frame memory 160 and the like via the bus 150.

The display unit 130 displays the image data. As the display unit 130, for example, a liquid crystal panel or an organic electro luminescence (EL) panel is assumed. The operation unit 140 generates an operation signal in accordance with user operation.

The bus 150 is a common path through which the optical unit 110, the solid-state imaging element 200, the DSP circuit 120, the display unit 130, the operation unit 140, the frame memory 160, the storage unit 170, and the power supply unit 180 exchange data with each other.

The frame memory 160 holds the image data. The storage unit 170 stores various data such as the image data. The power supply unit 180 supplies power to the solid-state imaging element 200, the DSP circuit 120, the display unit 130, and the like.

Configuration Example of Solid-State Imaging Element

Figure 2:
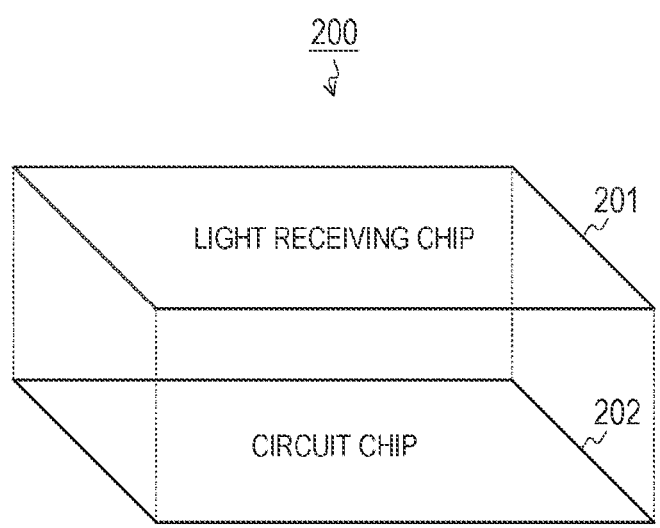
FIG. 2 is a diagram illustrating an example of a laminated structure of a solid-state imaging element in the first embodiment of the present technology.

FIG. 2 is a diagram illustrating an example of a laminated structure of the solid-state imaging element 200 in the first embodiment of the present technology. The solid-state imaging element 200 includes a circuit chip 202 and a light receiving chip 201 laminated on the circuit chip 202. Substrates of these are electrically connected together via a connection portion such as a via. Note that, in addition to the via, connection can also be made by Cu—Cu bonding, a bump, or inductively coupled communication technology such as ThruChip Interface (TCI).

Configuration Example of Light Receiving Chip

Figure 3:
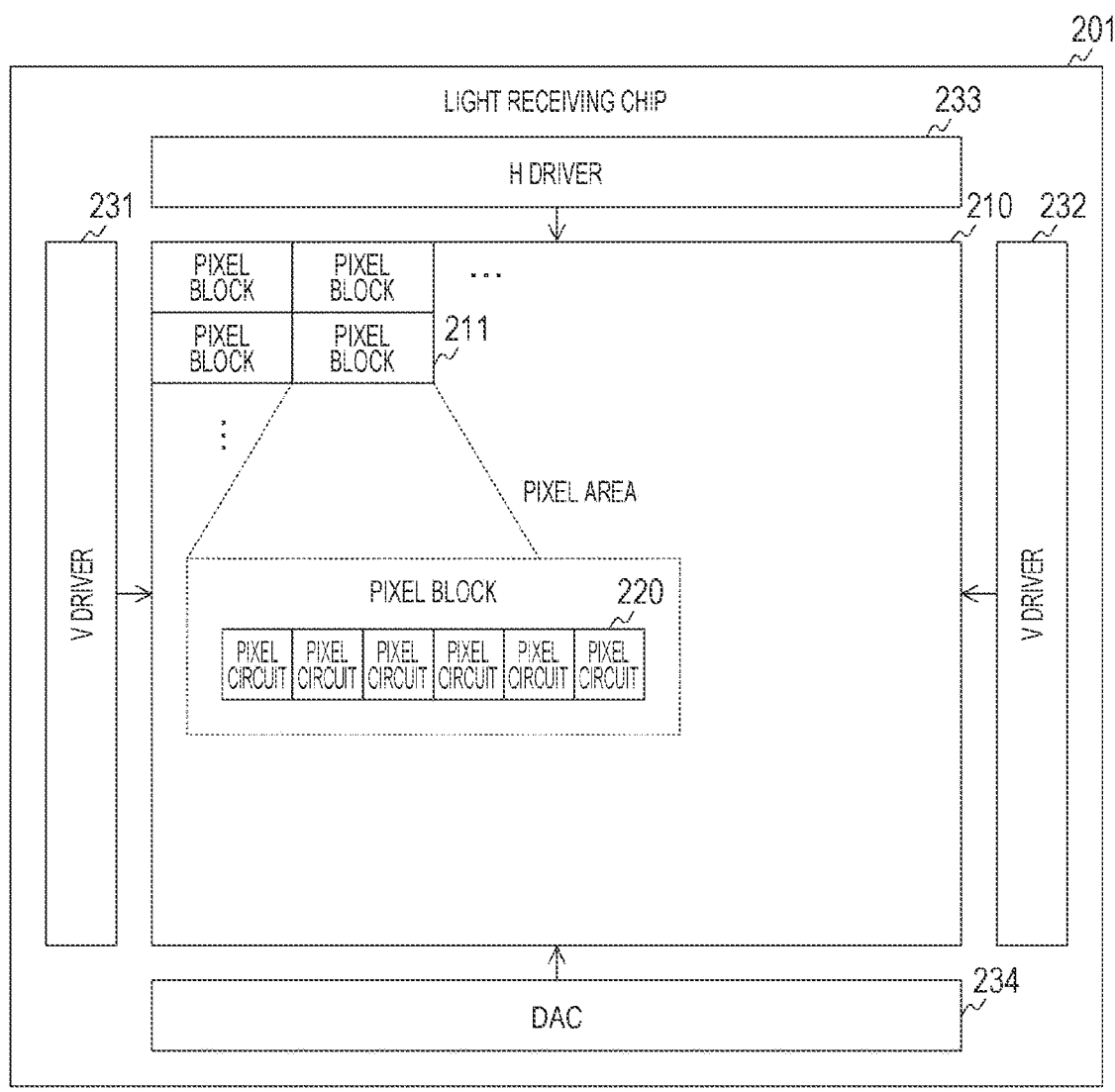
FIG. 3 is a block diagram illustrating a configuration example of a light receiving chip in the first embodiment of the present technology.

FIG. 3 is a plan view illustrating a configuration example of the light receiving chip 201 in the first embodiment of the present technology. On the light receiving chip 201, a pixel area 210, V drivers 231 and 232, an H driver 233, and a Digital to Analog Converter (DAC) 234 are arranged. Furthermore, in the pixel area 210, a plurality of pixel blocks 211 is arranged in a two-dimensional lattice. In each of the pixel blocks 211, a plurality of pixel circuits 220 is arranged. For example, in the pixel block 211, six pixel circuits 220 of one row×six columns are arranged. Furthermore, in the pixel block 211, a part of a comparison unit described later is arranged for each of the pixel circuits 220. Note that, the number of the pixel circuits 220 in the pixel block 211 is not limited to six.

The pixel circuit 220 generates an analog pixel signal by photoelectric conversion.

The V drivers 231 and 232 drive the pixel circuit 220 of a row to be read, and output the pixel signal. For example, the V driver 231 drives odd rows and the V driver 232 drives even rows. Furthermore, the H driver 233 drives the pixel circuit 220 on a column basis. Note that, it is not always necessary to divide rows driven by the V drivers 231 and 232 into even rows and odd rows. For example, the V drivers 231 and 232 can drive the same row for the purpose of faster settling.

The DAC 234 generates an analog ramp signal that changes in a slope shape as a reference signal by Digital to Analog (DA) conversion. The DAC 234 supplies the generated reference signal to the pixel area 210.

Configuration Example of Circuit Chip

Figure 4:
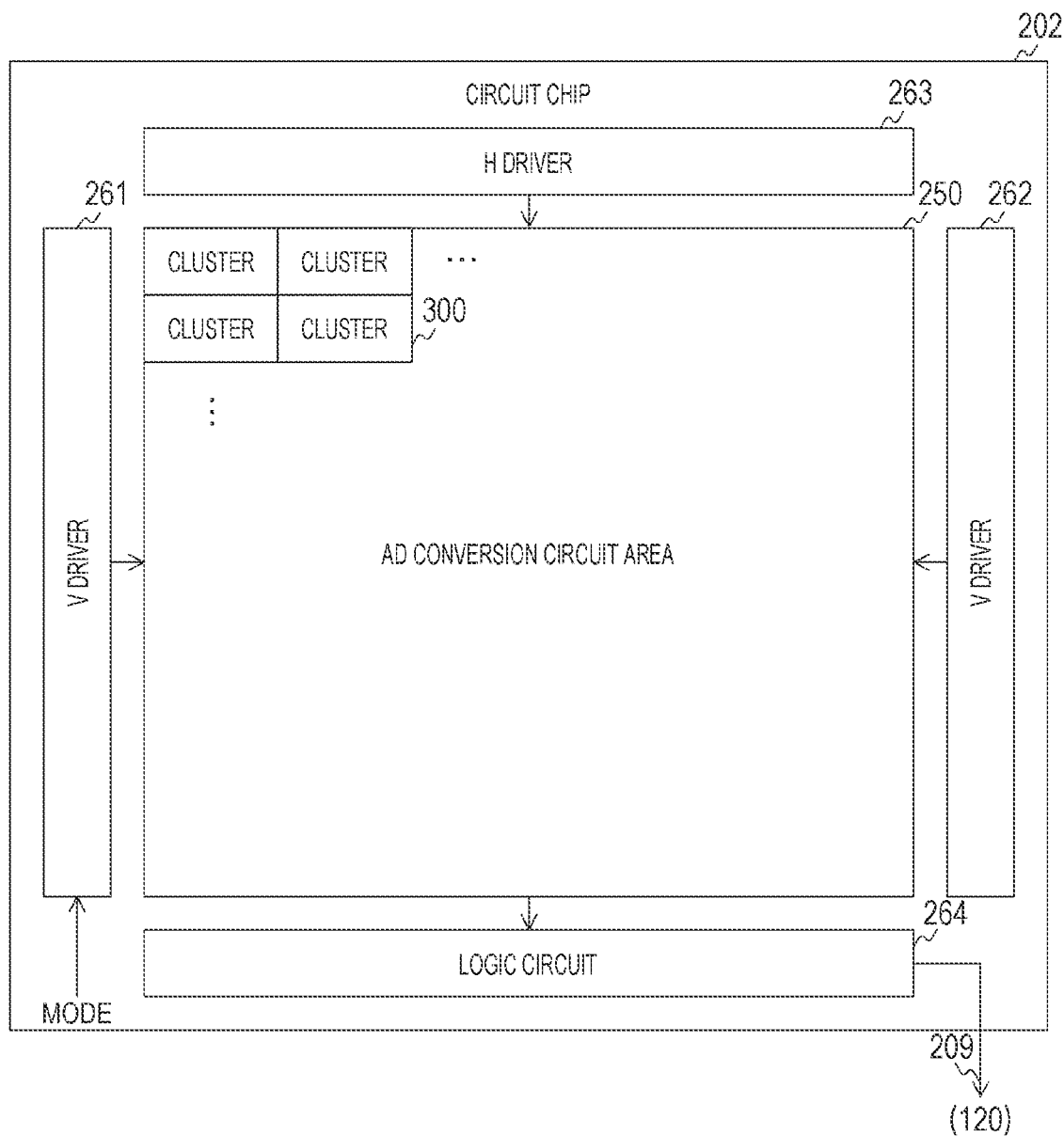
FIG. 4 is a block diagram illustrating a configuration example of a circuit chip in the first embodiment of the present technology.

FIG. 4 is a block diagram illustrating a configuration example of the circuit chip 202 in the first embodiment of the present technology. On the circuit chip 202, an AD conversion circuit area 250, V drivers 261 and 262, an H driver 263, and a logic circuit 264 are arranged. In the AD conversion circuit area 250, a plurality of clusters 300 is arranged in a two-dimensional lattice. The cluster 300 is provided for each pixel block 211, and when the number of pixel blocks 211 is N (N is an integer), N clusters 300 are also provided. The pixel block 211 and the cluster 300 are connected one-to-one.

The cluster 300 converts the analog signal from the corresponding pixel block 211 into a digital signal for each pixel and supplies the digital signal to the logic circuit 264 as pixel data.

The V drivers 261 and 262 drive circuits in the cluster 300 to generate digital signals. For example, the V driver 261 drives circuits corresponding to odd rows, and the V driver 262 drives circuits corresponding to even rows. Alternatively, the V drivers 261 and 262 drive a circuit in the same row. Furthermore, the H driver 263 transfers the generated digital signal from the cluster 300 to the logic circuit 264 as pixel data.

The logic circuit 264 performs various types of signal processing such as Correlated Double Sampling (CDS) processing for each pixel on the transferred pixel data. The logic circuit 264 supplies image data including the pixel data after the processing to the DSP circuit 120.

Configuration Example of Cluster

Figure 5:
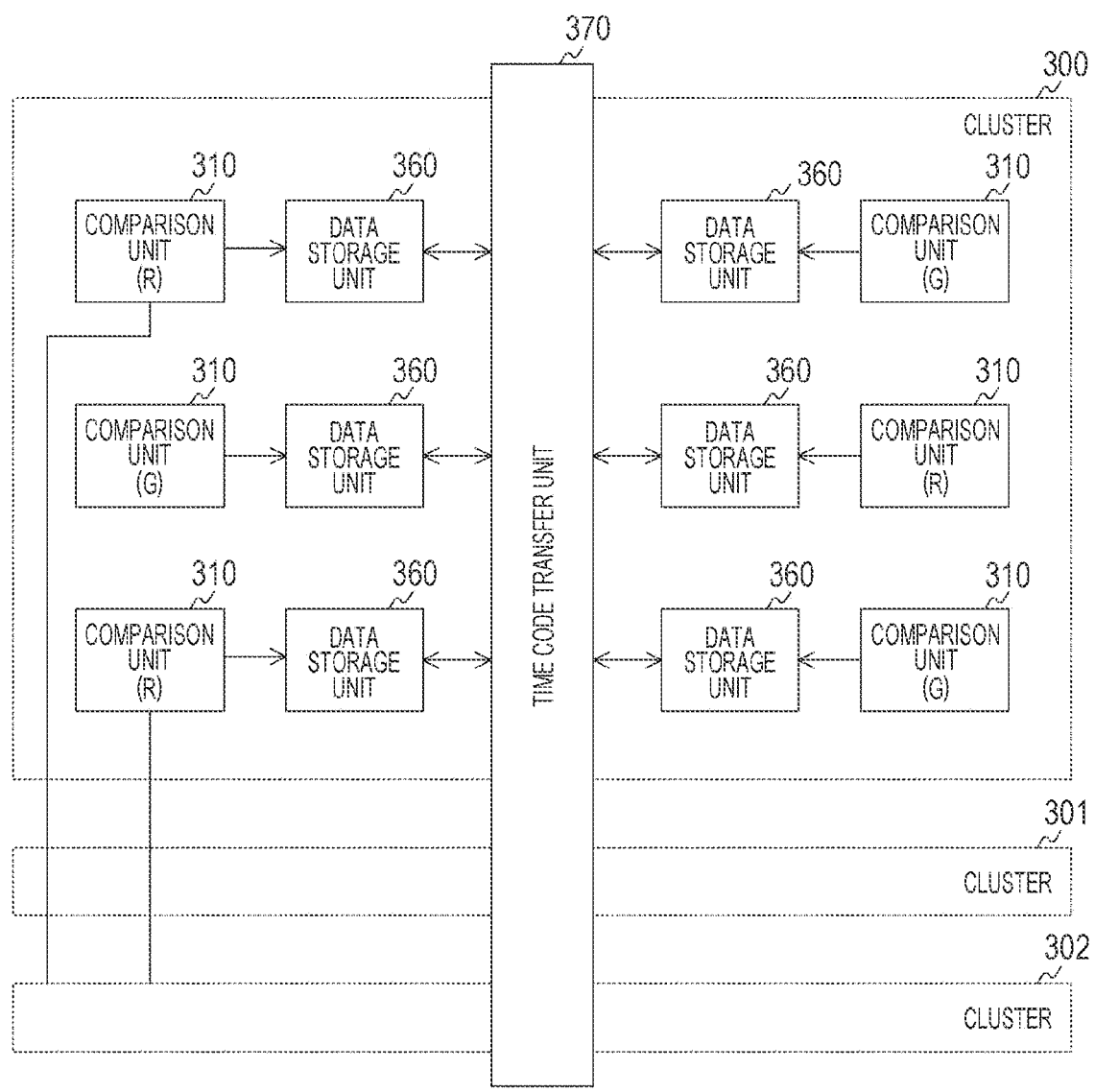
FIG. 5 is a block diagram illustrating a configuration example of a cluster in the first embodiment of the present technology.
Figure 9:
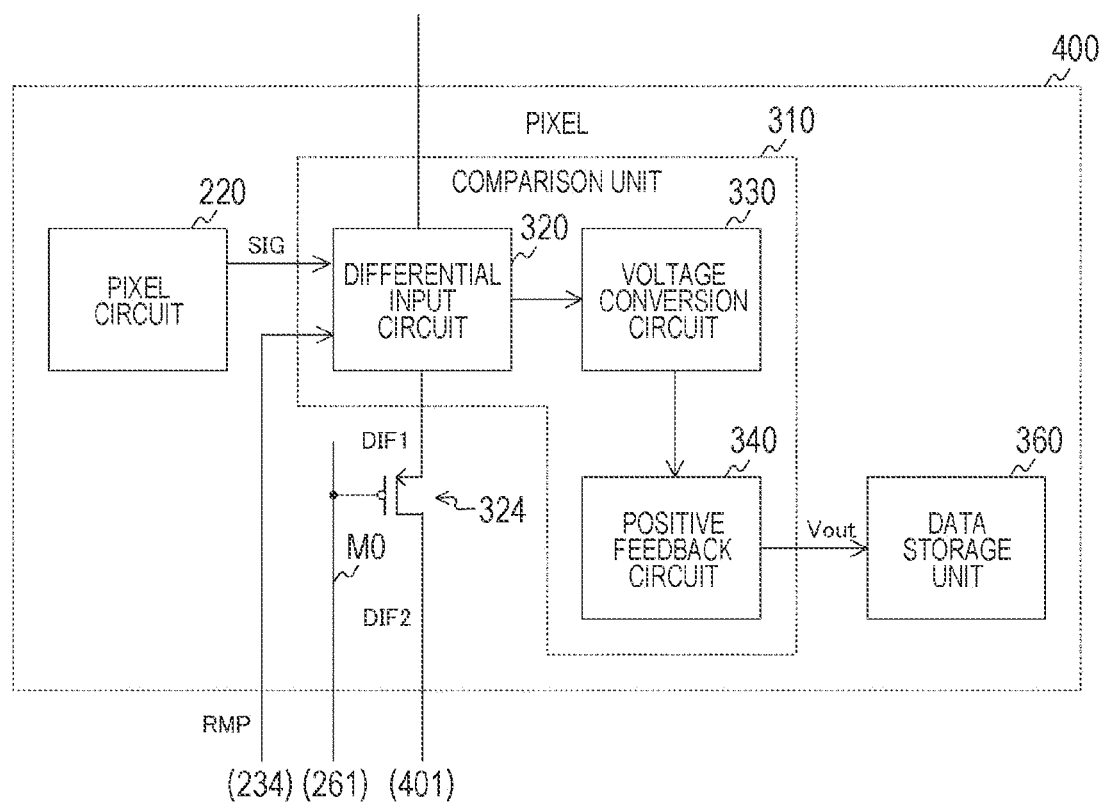
FIG. 9 is a block diagram illustrating a configuration example of a pixel in the first embodiment of the present technology.
Figure 10:
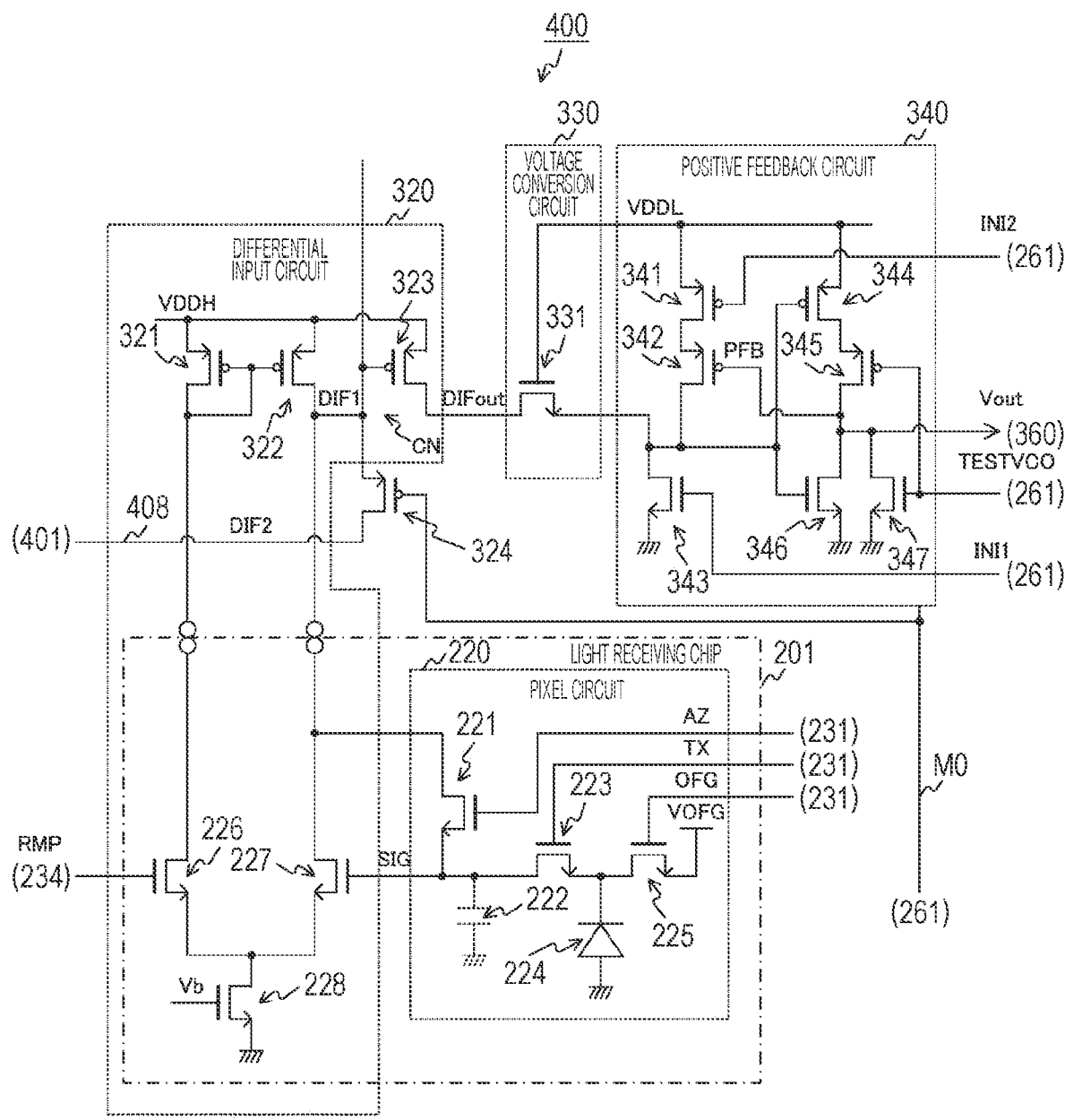
FIG. 10 is a circuit diagram illustrating a configuration example of a pixel in the first embodiment of the present technology.

FIG. 5 is a block diagram illustrating a configuration example of the cluster 300 in the first embodiment of the present technology. In the cluster 300, a comparison unit 310 and a data storage unit 360 are arranged for each pixel circuit 220 in the pixel block 211. In a case where there are six pixel circuits 220 in the pixel block 211, six each of the comparison units 310 and the data storage units 360 are arranged. Note that, in the figure, a connection transistor described later in FIG. 9 is omitted. Furthermore, a part of a differential input circuit in the comparison unit 310 is arranged on the light receiving chip 201 as illustrated in FIG. 10 described later.

Furthermore, in the AD conversion circuit area 250, a time code transfer unit 370 is arranged for each column of the cluster 300. In a case where the number of columns of the cluster 300 is M (M is an integer), M time code transfer units 370 are also arranged.

Furthermore, each of the six comparison units 310 is connected one-to-one with the six pixel circuits 220 in the pixel block 211 corresponding to the cluster 300.

The time code transfer unit 370 transfers a time code from a counter (not illustrated) that generates the time code to the cluster 300, and transfers the time code from the cluster 300 to the logic circuit 264. The time code is a digital signal indicating a time within a period in which the reference signal changes in a slope shape.

The comparison unit 310 compares the pixel signal from the corresponding pixel circuit 220 with the reference signal. The comparison unit 310 outputs a comparison result to the data storage unit 360.

The data storage unit 360 holds the time code (that is, the digital signal) as pixel data when the comparison result is inverted. Then, the data storage unit 360 outputs the held pixel data to the logic circuit 264 via the time code transfer unit 370. As a result, the analog pixel signal is converted into digital pixel data.

FIG. 6 is a perspective view illustrating an example of a connection relationship between the pixel circuit 220 and the circuits in the cluster 300 in the first embodiment of the present technology.

A coordinate of the pixel circuit 220 in the m-th (m is an integer) row and the n-th (n is an integer) column in the pixel block 211 is set as (m, n). The pixel circuits 220 at the left side coordinates (0, 0), (0, 1), and (0, 2) are connected to three comparison units 310 on the left side in the cluster 300. Furthermore, the pixel circuits 220 at coordinates (0, 3), (0, 4), and (0, 5) on the right side are connected to three comparison units 310 on the right side in the cluster 300. Note that, in the figure, "CM" indicates the comparison unit 310, and "MEM" indicates the data storage unit 360.

A circuit including one pixel circuit 220, and the comparison unit 310 and the data storage unit 360 connected to the one pixel circuit 220 constitutes one pixel in the solid-state imaging element 200. Since the six pixel circuits 220 are arranged in the pixel block 211, the number of pixels for each pixel block 211 is six.

FIG. 7 is a diagram illustrating an example of a connection relationship between pixels in the first embodiment of the present technology. In the solid-state imaging element 200, a plurality of pixels 400 such as Red (R) pixels, Green (G) pixels, and Blue (B) pixels is arranged in a two-dimensional lattice by a Bayer array or the like. The G pixel includes a Gr pixel adjacent to the R pixel in the horizontal direction, and a Gb pixel adjacent to the B pixel. Note that, the arrangement method of the pixels 400 is not limited to the Bayer array.

A pair of pixels of the same color adjacent to each other in the vertical direction (such as pixels 400 and 401) are connected to each other. In the figure, a solid line between the pixels indicates a wiring line connecting the pixels to each other. For example, the pixel 400 of R at the coordinate (0, 0) and the pixel 401 of R at the coordinate (2, 0) are connected to each other, and the R pixel at the coordinate (0, 2) and the R pixel at the coordinate (2, 2) are connected to each other. Furthermore, the R pixel at the coordinate (0, 4) and the R pixel at the coordinate (2, 4) are connected to each other. Similarly, in the third and subsequent rows, R pixels are connected to each other on two pixels basis. Similarly, for the G pixel and the B pixel, two pixels adjacent to each other in the vertical direction are connected to each other. Note that, connection relationships between the G pixels and between the B pixels are omitted in the figure.

The two connected pixels generate pixel data by being subjected to analog pixel addition in a pixel addition mode, and generate pixel data individually without pixel addition in a non-addition mode. Here, the pixel addition mode is a mode in which pixel addition is performed to generate image data, and the non-addition mode is a mode in which image data is generated without pixel addition.

Figure 8:
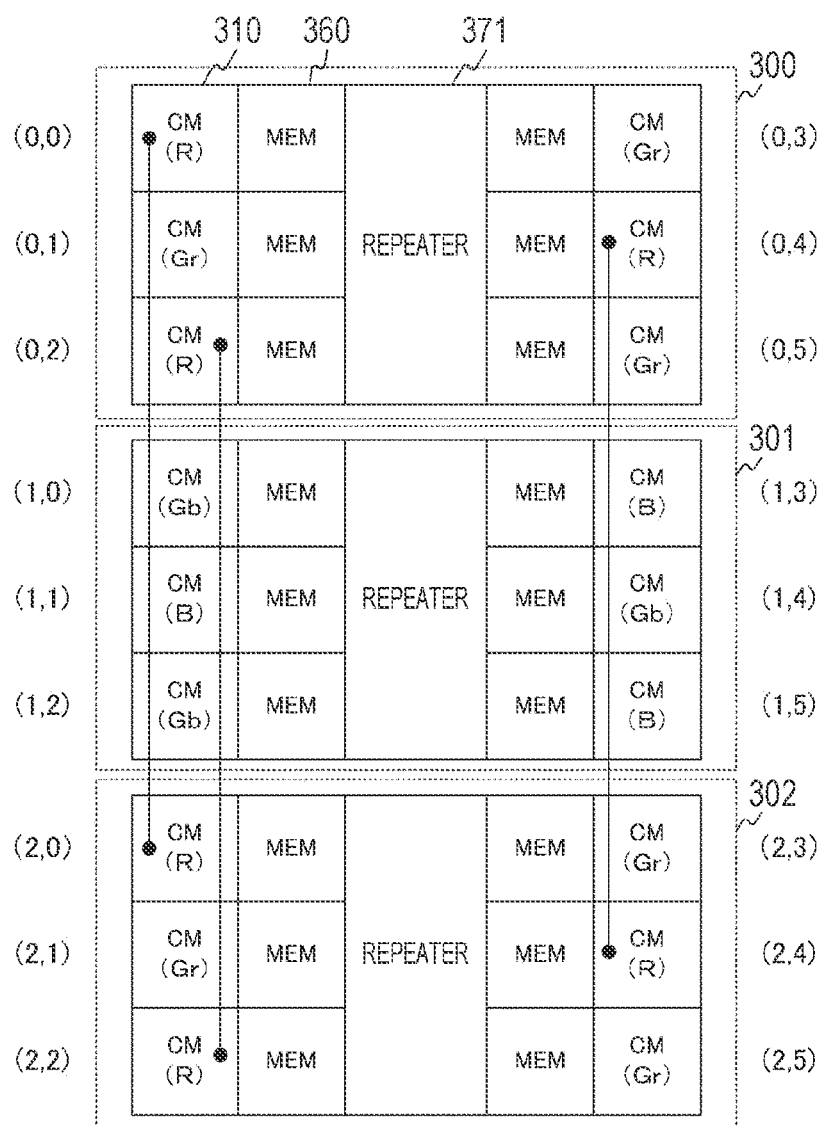
FIG. 8 is a diagram illustrating an example of a connection relationship between circuits in the cluster in the first embodiment of the present technology.

FIG. 8 is a diagram illustrating an example of a connection relationship between the circuits in the cluster 300 in the first embodiment of the present technology. Attention is paid to clusters 300, 301, and 302 arranged in the vertical direction. In the cluster 300, the comparison unit 310 and the data storage unit 360 are provided for each pixel, and a repeater 371 is further arranged. The same applies to the clusters 301 and 302. A set of the repeaters 371 arranged in the vertical direction corresponds to the time code transfer unit 370 of FIG. 5.

In the cluster 300, circuits corresponding to six pixels at coordinates (0, 0), (0, 1), (0, 2), (0, 3), (0, 4), and (0, 5) are arranged. In the cluster 301, circuits corresponding to six pixels at coordinates (1, 0), (1, 1), (1, 2), (1, 3), (1, 4), and (1, 5) are arranged. In the cluster 302, circuits corresponding to six pixels at coordinates (2, 0), (2, 1), (2, 2), (2, 3), (2, 4), and (2, 5) are arranged.

The comparison unit 310 corresponding to the coordinate (0, 0) and the comparison unit 310 corresponding to the coordinate (2, 0) are circuits of R pixels adjacent to each other in the Bayer array. These comparison units 310 are therefore connected to each other. In the figure, a solid line between a pair of the comparison units 310 indicates a wiring line connecting those circuits to each other. Similarly, the comparison unit 310 corresponding to the coordinate (0, 2) and the comparison unit 310 corresponding to the coordinate (2, 2) are connected to each other. Furthermore, the comparison unit 310 corresponding to the coordinate (0, 4) and the comparison unit 310 corresponding to the coordinate (2, 4) are connected to each other. Note that, in the figure, a connection relationship between a circuit corresponding to the G pixel and a circuit corresponding to the B pixel is omitted.

Configuration Example of Pixel

FIG. 9 is a circuit diagram illustrating a configuration example of the pixel 400 in the first embodiment of the present technology. The pixel 400 includes the pixel circuit 220, the comparison unit 310, a connection transistor 324, and the data storage unit 360. The comparison unit 310 includes a differential input circuit 320, a voltage conversion circuit 330, and a positive feedback circuit 340.

The pixel circuit 220 generates an analog pixel signal SIG by photoelectric conversion, as described above. The differential input circuit 320 amplifies a difference between the pixel signal SIG from the pixel circuit 220 and a reference signal RMP from the DAC 234. The voltage conversion circuit 330 converts a voltage of a signal from the differential input circuit 320. The positive feedback circuit 340 adds a part of an output to an input. The data storage unit 360 holds the time code as pixel data when an output signal Vout indicating the comparison result of the comparison unit 310 is inverted, as described above.

The connection transistor 324 connects an internal node in the pixel 400 and an internal node in the pixel 401 adjacent to the pixel 400 to each other in accordance with a control signal. Details of positions of the internal nodes will be described later in FIG. 10.

FIG. 10 is a circuit diagram illustrating a configuration example of the pixel 400 in the first embodiment of the present technology. The pixel 400 includes the pixel circuit 220, the differential input circuit 320, the connection transistor 324, the voltage conversion circuit 330, the positive feedback circuit 340, and the data storage unit 360. Note that, the data storage unit 360 is omitted in the figure.

The pixel circuit 220 includes, for example, a reset transistor 221, a floating diffusion layer 222, a transfer transistor 223, a photodiode 224, and a discharge transistor 225. As the reset transistor 221, the transfer transistor 223, the photodiode 224, and the discharge transistor 225, N-type Metal-Oxide-Semiconductor (MOS) transistors are used, for example.

The photodiode 224 generates electric charge by photoelectric conversion. The discharge transistor 225 discharges the electric charge from the photodiode 224 when an instruction of discharge is given by a drive signal OFG from a driver (V driver 231 or the like).

The transfer transistor 223 transfers the electric charge from the photodiode 224 to the floating diffusion layer 222 at the end of exposure when an instruction of transfer is given by a transfer signal TX from the driver.

The floating diffusion layer 222 stores the transferred electric charge and generates the analog pixel signal SIG at a level corresponding to an amount of the electric charge.

The reset transistor 221 initializes the floating diffusion layer 222 when an instruction of initialization is given by a reset signal AZ from the driver.

The differential input circuit 320 includes P-type transistors 321, 322, and 323, differential transistors 226 and 227, and a current source transistor 228. As the P-type transistors 321, 322, and 323, MOS transistors are used, for example. As the differential transistor 226, the differential transistor 227, and the current source transistor 228, N-type MOS transistors are used, for example.

Furthermore, the differential transistors 226 and 227, the current source transistor 228, and the pixel circuit 220 are arranged on the light receiving chip 201. The P-type transistors 321, 322, and 323 and subsequent circuits (voltage conversion circuit 330, and the like) are arranged on the circuit chip 202. Note that, circuits and elements arranged on each of the light receiving chip 201 and the circuit chip 202 are not limited to those illustrated in the figure.

The sources of the respective differential transistors 226 and 227 are connected commonly to the current source transistor 228. Furthermore, the gate of the differential transistor 227 is connected to the floating diffusion layer 222, and the gate of the differential transistor 226 is connected to the DAC 234.

A predetermined bias voltage Vb is applied to the gate of the current source transistor 228, and the source is grounded.

The P-type transistors 321, 322, and 323 are connected in parallel to a terminal of a power supply voltage VDDH. Furthermore, the gate of the P-type transistor 321 is connected to its own drain and the gate of the P-type transistor 322. Furthermore, the drain of the P-type transistor 321 is connected to the drain of the differential transistor 226, and the drain of the P-type transistor 322 is connected to the drain of the differential transistor 227. Furthermore, the gate of the P-type transistor 323 is connected to the drain of the P-type transistor 322, and the drain of the P-type transistor 323 is connected to the voltage conversion circuit 330. A connection node between the gate of the P-type transistor 323 and the drain of the P-type transistor 322 is hereinafter referred to as an "internal node CN".

A difference signal DIF1 obtained by amplifying a difference between the pixel signal SIG from the pixel circuit 220 and the reference signal RMP from the DAC 234 is input to the internal node CN.

The connection transistor 324 connects the internal node CN in the pixel 400 and the internal node CN in the pixel 401 adjacent to the pixel 400 in accordance with the control signal from a control line M0. A driver such as the V driver 261 supplies the control signal via the control line M0. In a case where a P-type transistor is used as the connection transistor 324, the driver supplies a low-level control signal in the pixel addition mode, and supplies a high-level control signal in the non-addition mode.

As a result, the connection transistor 324 shifts to a closed state in the pixel addition mode and shifts to an open state in the non-addition mode. When the connection transistor 324 shifts to the closed state, the internal nodes CN of the respective pixels 400 and 401 are connected to each other. As a result, the difference signal DIF1 in the pixel 400 and a difference signal DIF2 in the pixel 401 are subjected to analog addition, and a signal corresponding to an addition signal of the analog addition is output as a difference signal $DIF_{out}$. Note that, the connection transistor 324 is an example of an addition circuit described in the claims.

The voltage conversion circuit 330 includes an N-type transistor 331. As the N-type transistor 331, a MOS transistor is used, for example. The N-type transistor 331 is inserted between the differential input circuit 320 and the positive feedback circuit 340, and a power supply voltage VDDL lower than the power supply voltage VDDH is applied to the gate.

The positive feedback circuit 340 includes P-type transistors 341, 342, 344, and 345, and N-type transistors 343, 346, and 347. As these transistors, MOS transistors are used, for example.

The P-type transistor 341, the P-type transistor 342, and the N-type transistor 343 are connected in series between a terminal of the power supply voltage VDDL and a ground terminal. A drive signal INI2 from the driver such as the V driver 261 is input to the gate of the P-type transistor 341, and a drive signal INI1 from the driver such as the V driver 261 is input to the N-type transistor 343. A signal from the voltage conversion circuit 330 is input to a connection point between the P-type transistor 342 and the N-type transistor 343.

The P-type transistors 344 and 345 are connected in series to the terminal of the power supply voltage VDDL. Furthermore, the N-type transistors 346 and 347 are connected in parallel between the P-type transistor 345 and the ground terminal.

The gates of the P-type transistor 344 and the N-type transistor 346 are connected to the connection point between the P-type transistor 342 and the N-type transistor 343. From a connection point between the P-type transistor 345 and the N-type transistor 346, the output signal Vout is output to the data storage unit 360, and a positive feedback signal PFB is output to the gate of the P-type transistor 342. Furthermore, a drive signal TRSTVCO from the driver is input to the gates of the P-type transistor 345 and the N-type transistor 347.

With the configuration described above, the comparison unit 310 generates the difference signal DIF1 obtained by amplifying the difference between the pixel signal SIG and the reference signal RMP, and outputs the difference signal DIF1 to the internal node CN. Then, the comparison unit 310 outputs the output signal Vout corresponding to the signal of the internal node CN to the data storage unit 360.

Figure 11:
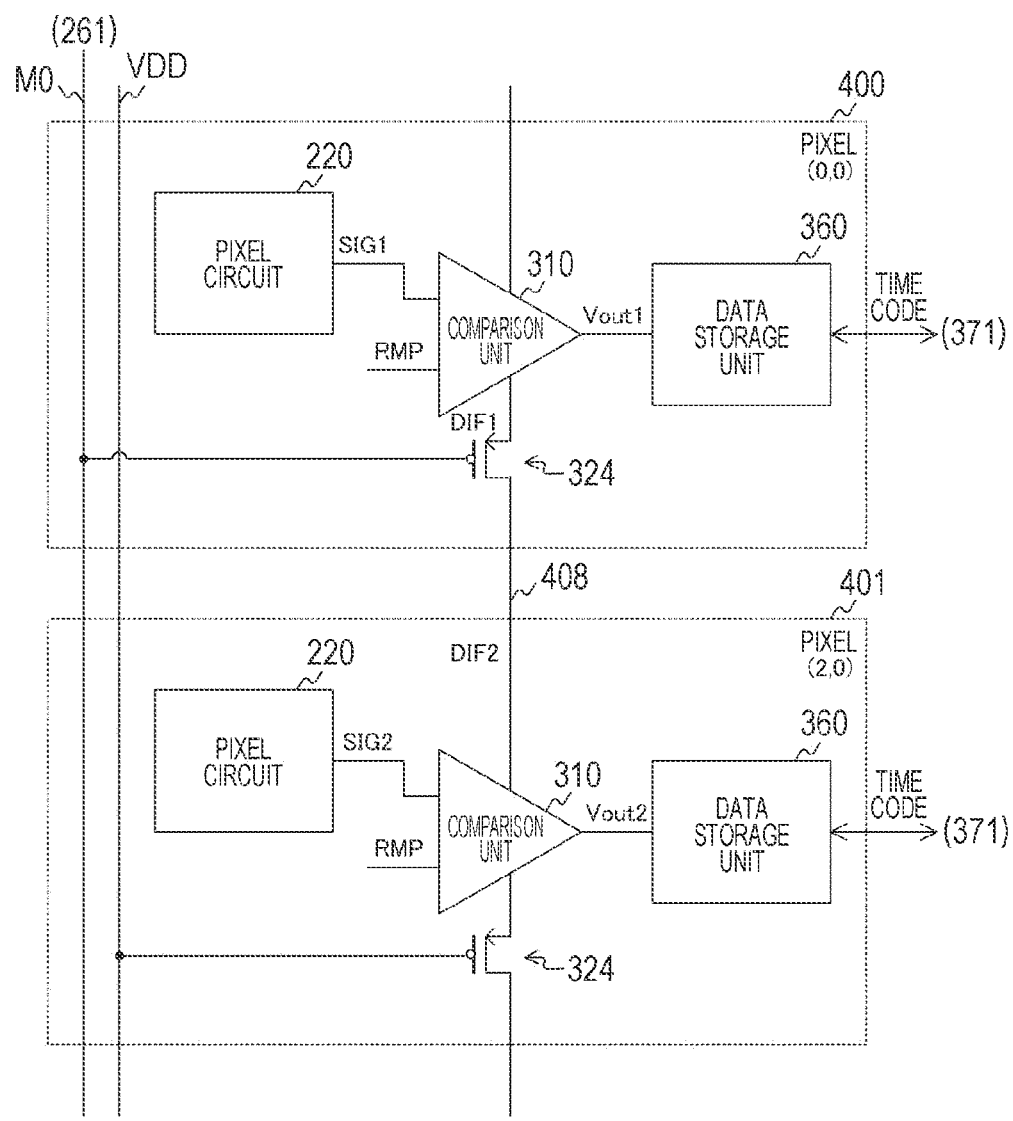
FIG. 11 is a diagram illustrating an example of a connection relationship of comparison units in the first embodiment of the present technology.

FIG. 11 is a diagram illustrating an example of a connection relationship of the comparison units 310 in the first embodiment of the present technology. Attention is paid to the pixels 400 and 401 of the same color (R or the like) adjacent to each other in the vertical direction. The pixel circuit 220, the comparison unit 310, the connection transistor 324, and the data storage unit 360 are arranged in each of the pixels 400 and 401.

The gate of the connection transistor 324 in the pixel 400 is connected to the control line M0. On the other hand, the gate of the connection transistor 324 in the pixel 401 is connected to a power supply line VDD. As a result, the connection transistor 324 in the pixel 400 is turned on and off in accordance with the control signal, while the connection transistor 324 in the pixel 401 is always in an off state.

The comparison unit 310 in the pixel 400 internally generates the difference signal DIF1 obtained by amplifying the difference between the analog pixel signal SIG1 and the reference signal RMP. On the other hand, the comparison unit 310 in the pixel 401 internally generates the difference signal DIF2 obtained by amplifying a difference between a pixel signal SIG2 and the reference signal RMP.

In the pixel addition mode, the connection transistor 324 in the pixel 400 is turned on in accordance with the control signal and shifts to the closed state. As a result, the difference signal DIF1 obtained by amplifying the difference between the pixel signal and the reference signal in the pixel 400 to which a predetermined coordinate is assigned, and the difference signal DIF2 regarding another coordinate adjacent to the predetermined coordinate are subjected to analog addition. Then, the data storage unit 360 of one of the pixels 400 and 401 holds the time code when the output signal Vout corresponding to the addition signal is inverted as pixel data, and the data storage unit 360 of the other stops operation. As a result, the number of pixel data is halved in the vertical direction.

Furthermore, in the non-addition mode, the connection transistor 324 in the pixel 400 is turned off in accordance with the control signal. As a result, the data storage unit 360 in the pixel 400 holds the time code when an output signal Vout1 corresponding to the difference signal DIF1 is inverted as pixel data. Furthermore, the data storage unit 360 of the pixel 401 holds the time code when an output signal Vout2 corresponding to the difference signal DIF2 is inverted as pixel data.

Note that, the connection transistor 324 in the pixel 401 is always in the off state, but the configuration is not limited to this. The gate of the connection transistor 324 in the pixel 401 can also be connected to a control line different from the control line M0. In this case, in the pixel addition mode, one of the connection transistor 324 in the pixel 400 or the connection transistor 324 in the pixel 401 is controlled to be in the on state and the other is controlled to be in the off state.

By pixel addition, degradation of image quality can be suppressed as compared with a case where pixel signals are thinned out. Furthermore, by analog addition of the difference signals, the number of AD conversions is reduced as compared with the case of digital addition, so that power consumption can be reduced. Furthermore, pixel addition is performed in the solid-state imaging element 200 that performs AD conversion for each pixel, whereby a plurality of pixels arranged in the vertical direction and the horizontal direction can be addition targets. On the other hand, in a case where pixel addition is performed in a solid-state imaging element that performs AD conversion for each column, a plurality of pixels arranged in the horizontal direction can be addition targets, but a plurality of pixels arranged in the vertical direction cannot be addition targets.

Figure 12A:
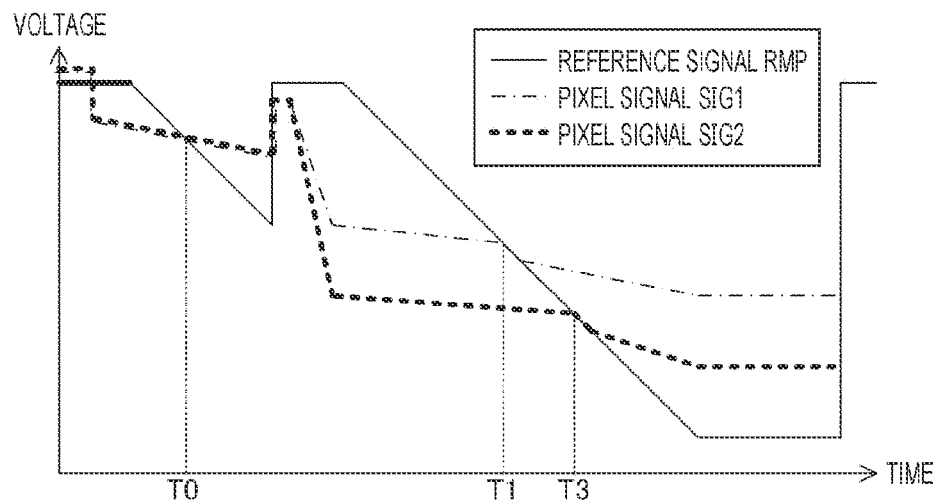
FIGS. 12A, 12B, and 12C are graphs illustrating an example of fluctuations in a pixel signal, a reference signal, and an output signal in the first embodiment of the present technology.
Figure 12B:
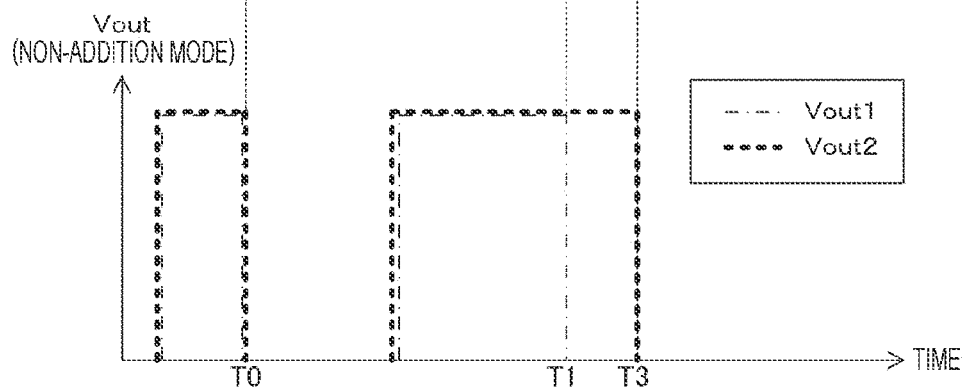
Figure 12C:
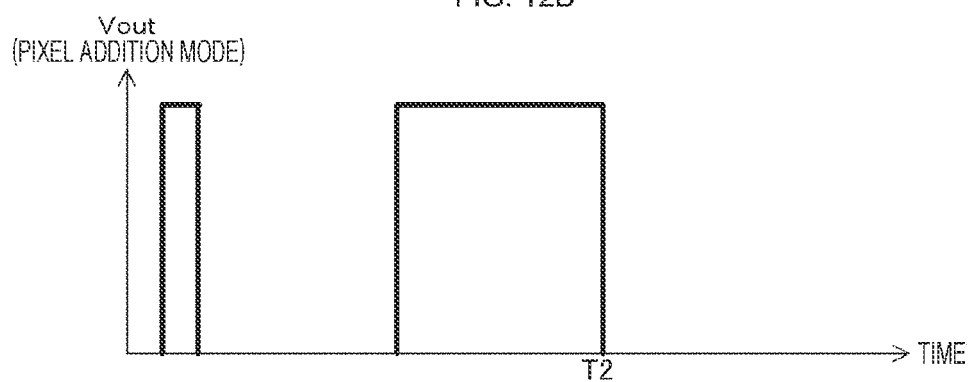

FIGS. 12A, 12B, and 12C are graphs illustrating an example of fluctuations in the pixel signal, the reference signal, and the output signal in the first embodiment of the present technology. FIG. 12A is a graph illustrating an example of fluctuations in the pixel signal and the reference signal in the non-addition mode. In FIG. 12A, the horizontal axis indicates time, and the vertical axis indicates voltages of the pixel signal and the reference signal. Furthermore, the solid line indicates the fluctuation of the reference signal RMP, and the one dot chain line indicates the fluctuation of the pixel signal SIG1 of the pixel 400. The thick dotted line indicates the fluctuation of the pixel signal SIG2 of the pixel 401. FIG. 12B illustrates an example of the fluctuation of the output signal of the comparison unit 310 in the non-addition mode, and FIG. 12C illustrates an example of the fluctuation of the output signal in the pixel addition mode. In FIGS. 12B and 12C, the horizontal axis illustrates time, and the vertical axis illustrates a voltage of the output signal Vout of the comparison unit 310. Furthermore, the one dot chain line indicates the fluctuation of the output signal Vout1 of the pixel 400. The thick dotted line indicates the fluctuation of the output signal Vout2 of the pixel 401. The solid line indicates the fluctuation of the output signal Vout in the addition mode.

As illustrated in FIG. 12A, the reference signal RMP fluctuates in a slope shape. On the other hand, when the pixels 400 and 401 are initialized, the pixel circuit 220 of the pixel 400 outputs a reset level pixel signal SIG1r, and the pixel circuit 220 of the pixel 401 outputs a reset level pixel signal SIG2r. Then, at a timing T0, the pixel signals SIG1r and SIG2r are higher than the reference signal RMP, and the comparison units 310 of the pixels 400 and 401 invert the output signal Vout indicating the comparison result.

Then, in the non-addition mode, the pixel circuit 220 of the pixel 400 outputs a signal level pixel signal SIG1s at the end of exposure, and the pixel circuit 220 of the pixel 401 outputs a signal level pixel signal SIG2s. These signal levels are different from each other. For this reason, for example, at a timing T1, the pixel signal SIG1s is higher than the reference signal RMP, and at a later timing T3, the pixel signal SIG2s is higher than the reference signal RMP. As a result, as illustrated in FIG. 12B, the comparison unit 310 of the pixel 400 inverts the output signal Vout1 at the timing T1, and the comparison unit 310 of the pixel 401 inverts the output signal Vout2 at the timing T3. As a result, pixel data is generated for each pixel.

On the other hand, as illustrated in FIG. 12C, in the pixel addition mode, the comparison unit 310 of the pixel 400 or the pixel 401 outputs the output signal Vout corresponding to the addition signal. Since the output signal Vout is an analog addition of the signals of the respective pixels 400 and 401, the output signal Vout is inverted at a timing T2 between the timings T1 and T3. As a result, resolution is reduced in the vertical direction.

Operation Example of Solid-State Imaging Element

Figure 13:
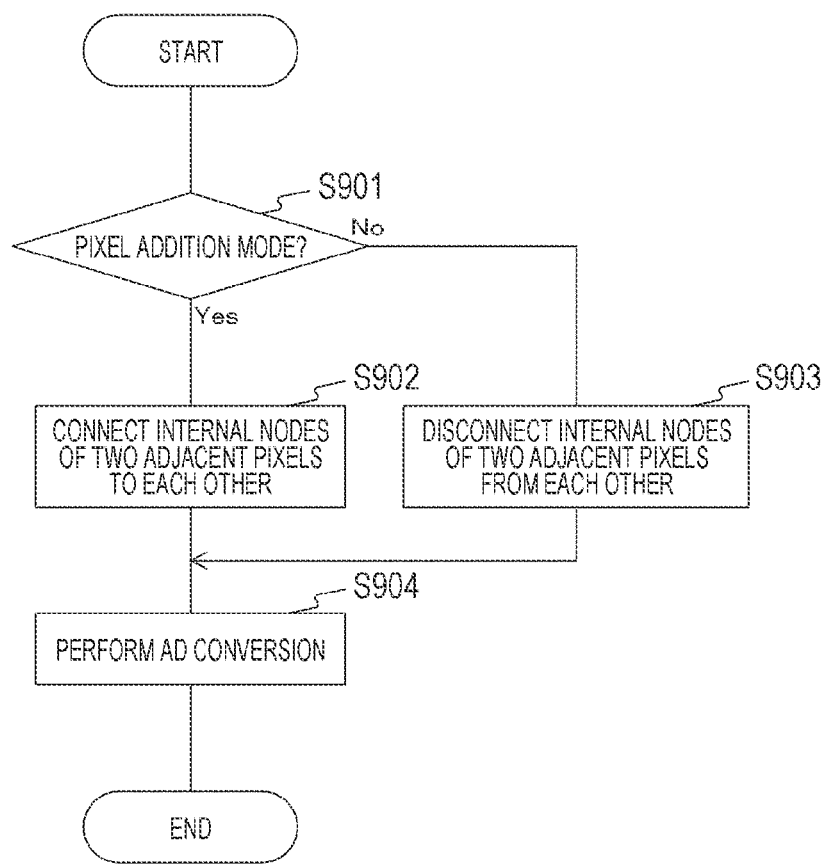
FIG. 13 is a flowchart illustrating an example of operation of the solid-state imaging element in the first embodiment of the present technology.

FIG. 13 is a flowchart illustrating an example of operation of the solid-state imaging element 200 in the first embodiment of the present technology. The operation is started, for example, when a predetermined application for capturing an image is executed. The solid-state imaging element 200 determines whether or not the current mode is the pixel addition mode (step S901).

In the case of the pixel addition mode (step S901: Yes), the connection transistor 324 in the solid-state imaging element 200 shifts to the on state, and connects the internal nodes CN of the respective two adjacent pixels to each other (step S902). As a result, the difference signals of those pixels are subjected to analog addition.

On the other hand, in the case of the non-addition mode (step S901: No), the connection transistor 324 in the solid-state imaging element 200 shifts to the off state, and disconnects the internal nodes CN of the respective two adjacent pixels from each other (step S903). Then, after step S902 or S903, each of the pixels in the solid-state imaging element 200 performs AD conversion (step S904). After step S904, the solid-state imaging element 200 ends the operation for imaging.

Note that, in a case where a plurality of image data is continuously captured, steps S901 to S904 are repeatedly executed in synchronization with the vertical synchronization signal.

As described above, according to the first embodiment of the present technology, since the connection transistor 324 performs analog addition of the difference signals of the respective two adjacent pixels, the image quality of the image data can be improved as compared with the case where the pixel signals are thinned out. Furthermore, since the number of AD conversions is smaller than that in the case of digital addition, the power consumption can be reduced.

[Modification]

In the first embodiment described above, the solid-state imaging element 200 performs pixel addition of two pixels of the same color adjacent to each other in the vertical direction to reduce the resolution in the vertical direction, but with this configuration, the resolution cannot be reduced in the horizontal direction. The solid-state imaging element 200 of a modification of the first embodiment is different from the first embodiment in that pixel addition is performed of two pixels of the same color adjacent to each other in the horizontal direction.

FIG. 14 is a diagram illustrating an example of a connection relationship between pixels in the modification of the first embodiment of the present technology. The solid-state imaging element 200 in the modification of the first embodiment is different from the first embodiment in that a pair of pixels of the same color adjacent to each other in the horizontal direction (for example, pixels 400 and 401) are connected to each other. In the figure, a solid line between the pixels indicates a wiring line connecting the pixels to each other.

For example, the pixel 400 of R at the coordinate (0, 0) and the pixel 401 of R at the coordinate (0, 2) are connected to each other, and the R pixel at the coordinate (2, 0) and the R pixel at the coordinate (2, 2) are connected to each other. Similarly, for the G pixel and the B pixel, two pixels adjacent to each other in the horizontal direction are connected to each other. The connection transistor 324 performs analog-addition of the difference signals of the respective two pixels connected to each other. Note that, connection relationships between the G pixels and between the B pixels are omitted in the figure.

As described above, according to the modification of the first embodiment of the present technology, since the connection transistor 324 performs analog-addition of the difference signals of the respective two pixels adjacent to each other in the horizontal direction, the number of pixel data can be reduced in the horizontal direction.

2. Second Embodiment

In the first embodiment described above, two pixels adjacent to each other in the vertical direction are added together to reduce the number of pixel data in the vertical direction, but in a case where two pixels are added together, only half of the pixel data can be reduced. The solid-state imaging element 200 of a second embodiment is different from the first embodiment in that three pixels adjacent to each other in the vertical direction are added together.

FIG. 15 is a diagram illustrating an example of a connection relationship between pixels in the second embodiment of the present technology. Three pixels of the same color adjacent to each other in the vertical direction (such as pixels 400, 401, and 402) are connected to each other. In the figure, a solid line between the pixels indicates a wiring line connecting the pixels to each other. For example, the pixel 400 of R at the coordinate (0, 0), the pixel 401 of R at the coordinate (2, 0), and the pixel 402 of R at the coordinate (4, 0) are connected to each other. Furthermore, the R pixel at the coordinate (0, 2), the R pixel at the coordinate (2, 2), and the R pixel at the coordinate (4, 2) are connected to each other, and the R pixel at the coordinate (0, 4), the R pixel at the coordinate (2, 4), and the R pixel at the coordinate (4, 4) are connected to each other. Similarly, in the fifth and subsequent rows, R pixels are connected to each other on three pixels basis. Similarly, for the G pixel and the B pixel, three pixels adjacent to each other in the vertical direction are connected to each other. Note that, connection relationships between the G pixels and between the B pixels are omitted in the figure.

Figure 16:
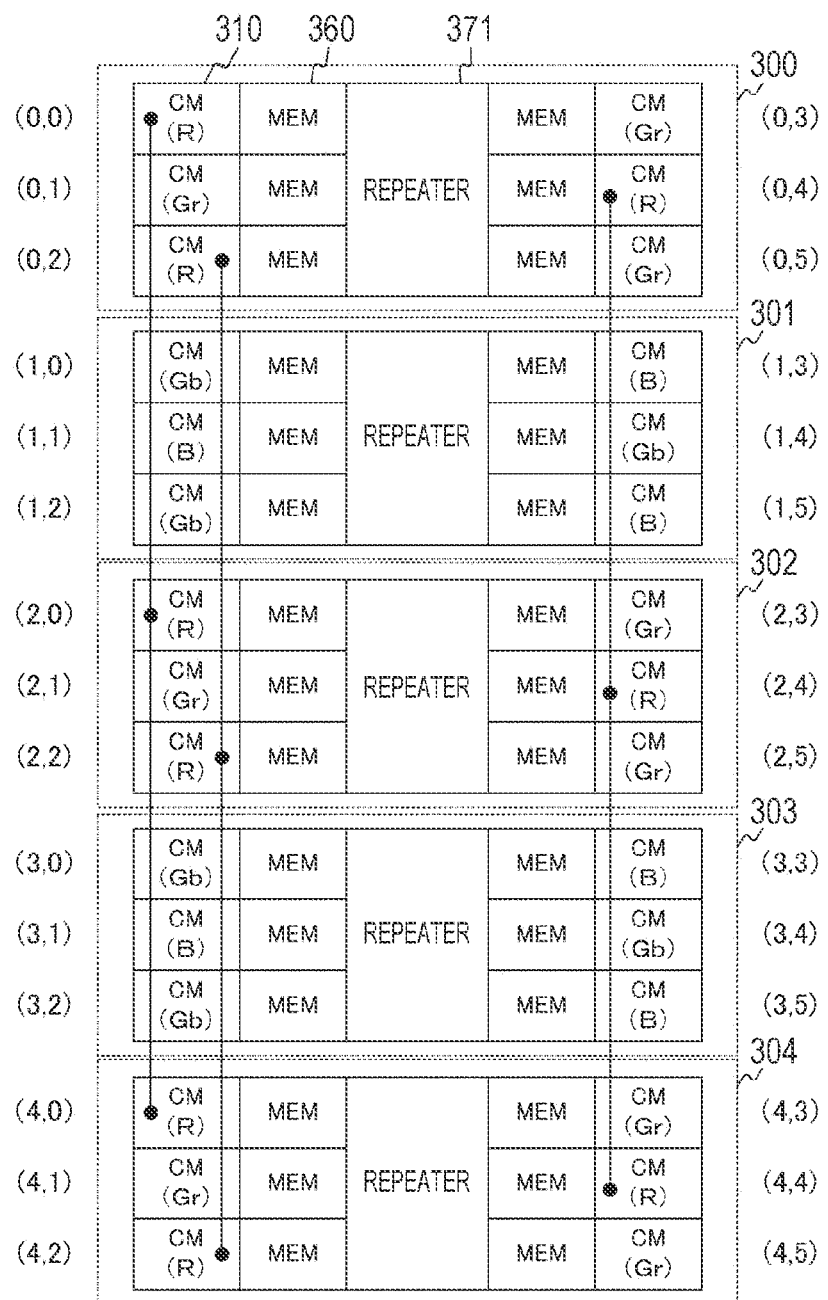
FIG. 16 is a diagram illustrating an example of a connection relationship between circuits in clusters in the second embodiment of the present technology.

FIG. 16 is a diagram illustrating an example of a connection relationship between the circuits in the clusters in the second embodiment of the present technology. Attention is paid to clusters 300, 301, 302, 303, and 304 arranged in the vertical direction.

Circuits arranged in the clusters 300, 301, and 302 are similar to those in the first embodiment. In the cluster 303, circuits corresponding to six pixels at coordinates (3, 0), (3, 1), (3, 2), (3, 3), (3, 4), and (3, 5) are arranged. In the cluster 304, circuits corresponding to six pixels at coordinates (4, 0), (4, 1), (4, 2), (4, 3), (4, 4), and (4, 5) are arranged.

The comparison unit 310 corresponding to the coordinate (0, 0), the comparison unit 310 corresponding to the coordinate (2, 0), and the comparison unit 310 corresponding to the coordinate (4, 0) are circuits of the R pixels adjacent to each other in the Bayer array. These comparison units 310 are therefore connected to each other. In the figure, solid lines between the three comparison units 310 illustrate wiring lines connecting those circuits to each other. Similarly, the comparison unit 310 corresponding to the coordinate (0, 2), the comparison unit 310 corresponding to the coordinate (2, 2), and the comparison unit 310 corresponding to the coordinate (4, 2) are connected to each other. Furthermore, the comparison unit 310 corresponding to the coordinate (0, 4), the comparison unit 310 corresponding to the coordinate (2, 4), and the comparison unit 310 corresponding to the coordinate (4, 4) are connected to each other. Note that, in the figure, a connection relationship between a circuit corresponding to the G pixel and a circuit corresponding to the B pixel is omitted.

Figure 17:
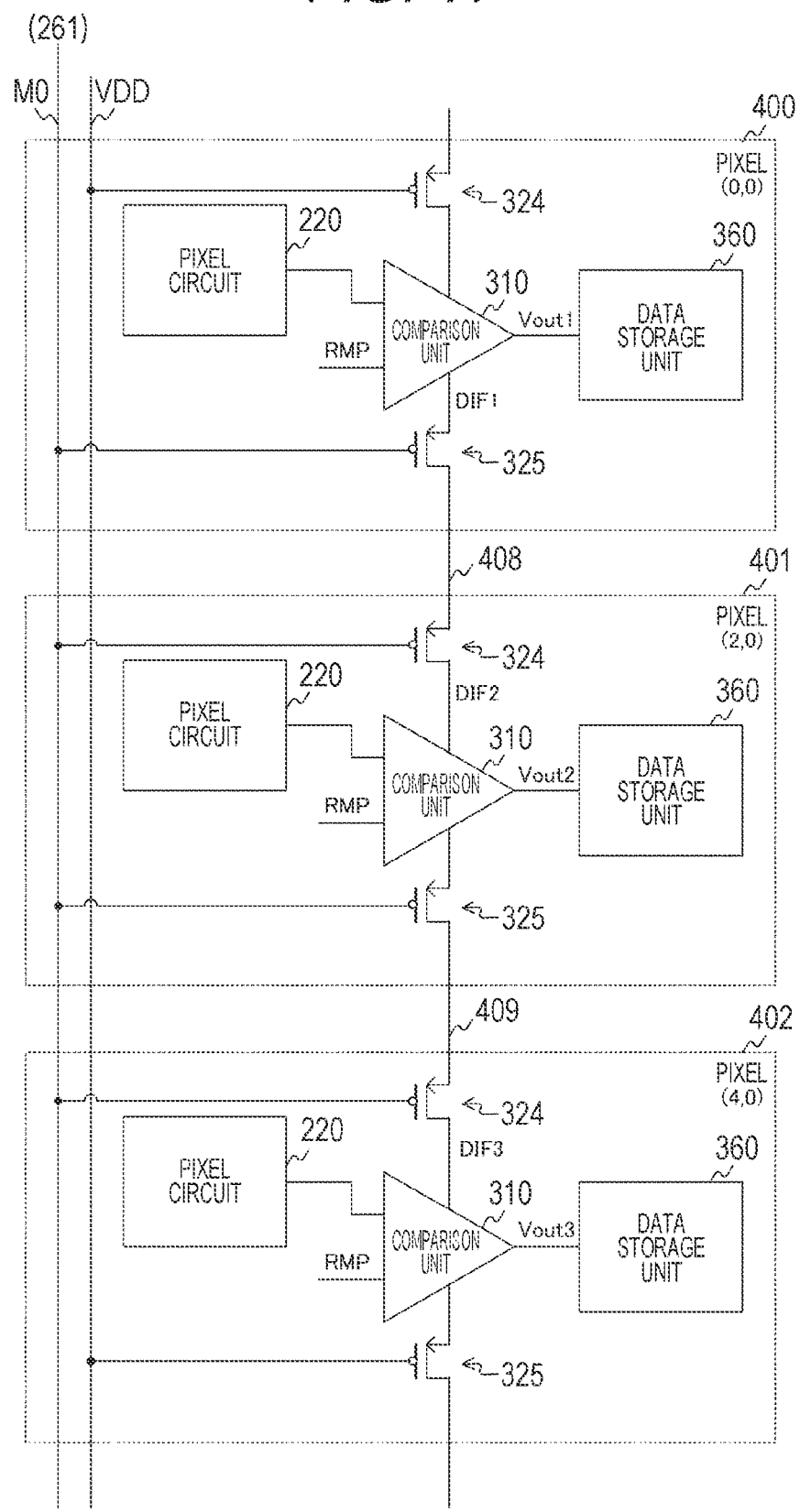
FIG. 17 is a diagram illustrating an example of a connection relationship of comparison units in the second embodiment of the present technology.

FIG. 17 is a diagram illustrating an example of a connection relationship of the comparison units 310 in the second embodiment of the present technology. Attention is paid to the pixels 400, 401, and 402 of the same color (R or the like) adjacent to each other in the vertical direction. A connection transistor 325 is further arranged on each of the pixels 400, 401, and 402. As the connection transistor 325, a P-type MOS transistors is used, for example. These connection transistors 325 are added from a viewpoint of providing symmetry in a layout.

The gate of the connection transistor 324 in the pixel 400 is connected to the power supply line VDD, and the gate of the connection transistor 325 is connected to the control line M0. Furthermore, the gates of both the connection transistors 324 and 325 in the pixel 401 are connected to the control line M0. The gate of the connection transistor 324 in the pixel 402 is connected to the control line M0, and the gate of the connection transistor 325 is connected to the power supply line VDD. As a result, the connection transistor 325 in the pixel 400, the connection transistors 324 and 325 in the pixel 401, and the connection transistor 324 in the pixel 402 are turned on and off in accordance with the control signal. On the other hand, the connection transistor 324 in the pixel 400 and the connection transistor 325 in the pixel 402 are always in the off state.

The comparison unit 310 in the pixel 400 internally generates the difference signal DIF1. The comparison unit 310 in the pixel 401 internally generates the difference signal DIF2, and the comparison unit 310 in the pixel 402 internally generates a difference signal DIF3.

In the pixel addition mode, the connection transistor 325 in the pixel 400, the connection transistors 324 and 325 in the pixel 401, and the connection transistor 324 in the pixel 402 are turned on in accordance with the control signal. As a result, the difference signal DIF1 of the pixel 400 at a predetermined coordinate and the difference signals DIF2 and DIF3 of the pixels 400 and 401 at coordinates adjacent to the predetermined coordinate are added together. Then, the data storage unit 360 of any of the pixels 400, 401, and 402 holds the time code when the output signal Vout corresponding to the addition signal is inverted, and the data storage units 360 in the remaining pixels stop operation.

Furthermore, in the non-addition mode, the connection transistor 325 in the pixel 400, the connection transistors 324 and 325 in the pixel 401, and the connection transistor 324 in the pixel 402 are turned off in accordance with the control signal. As a result, the data storage unit 360 in the pixel 400 holds the time code when the output signal Vout1 corresponding to the difference signal DIF1 is inverted. Furthermore, the data storage unit 360 in the pixel 401 holds the time code when the output signal Vout2 corresponding to the difference signal DIF2 is inverted, and the data storage unit 360 in the pixel 402 holds the time code when an output signal Vout3 corresponding to the difference signal DIF3 is inverted.

Note that, the connection transistor 324 in the pixel 400 and the connection transistor 325 in the pixel 402 are always in the off state, but the configuration is not limited to this. The connection transistors can be turned on and off by connecting the gates of these connection transistors to a control line different from the control line M0.

Figure 18:
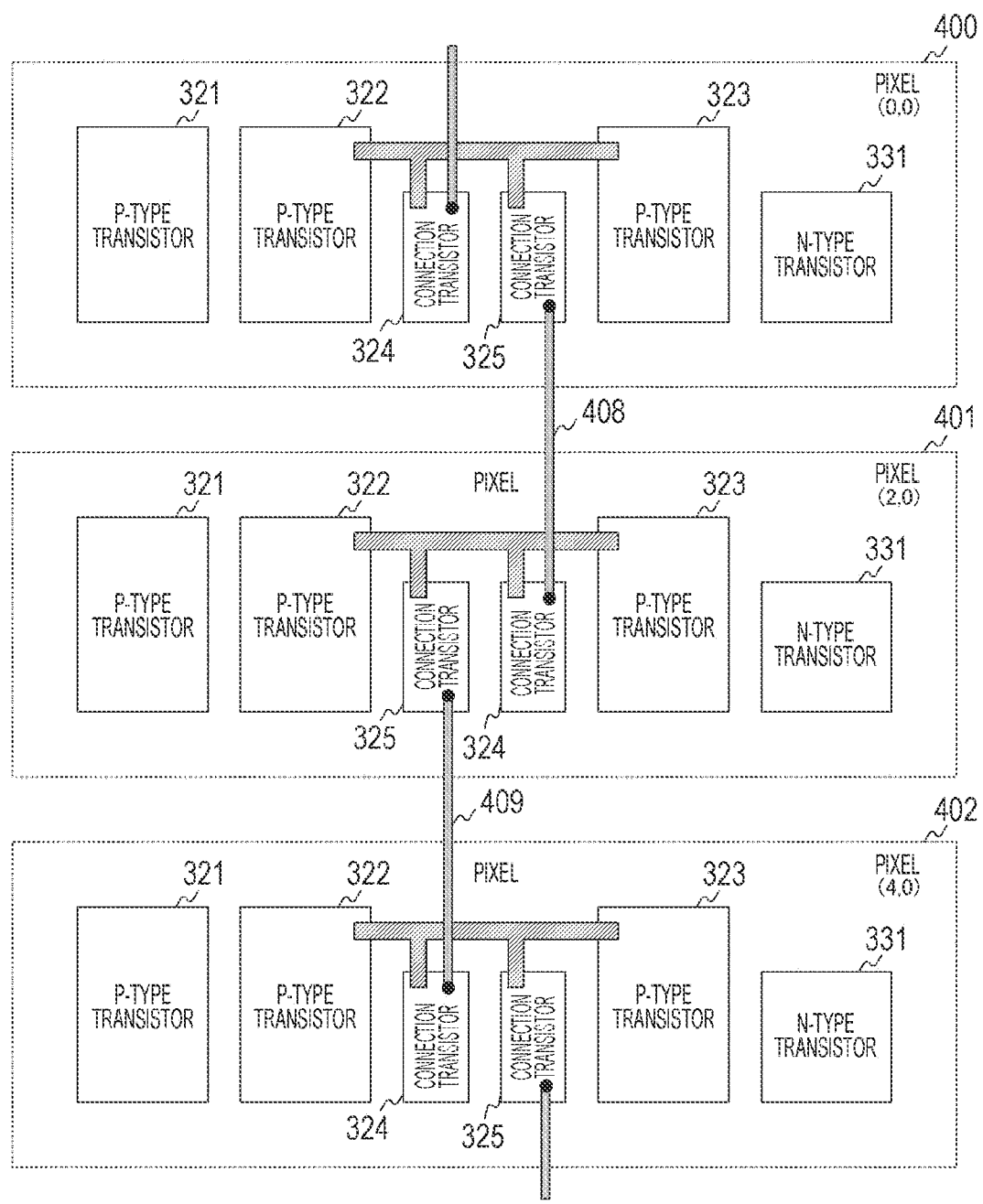
FIG. 18 is a diagram illustrating an example of a layout of elements in pixels in the second embodiment of the present technology.

FIG. 18 is a diagram illustrating an example of a layout of elements in the pixel 401 in the second embodiment of the present technology. Attention is paid to the pixels 400, 401, and 402 of the same color adjacent to each other in the vertical direction.

In the pixel 400, various elements are arranged including the P-type transistors 321 and 322, the connection transistors 324 and 325, the P-type transistor 323, and the N-type transistor 331. In the figure, elements other than these (N-type transistor 331, and the like) are omitted. The same applies to the pixels 401 and 402.

The connection transistors 324 and 325 are arranged, for example, between the P-type transistor 322 and the P-type transistor 323.

In the pixel 400, the drain of the connection transistor 324 is connected to the drain of the P-type transistor 322 and the gate of the P-type transistor 323. Furthermore, the source of the connection transistor 325 is connected to the drain of the P-type transistor 322 and the gate of the P-type transistor 323. The drain of the connection transistor 325 in the pixel 400 is connected to the source of the connection transistor 324 in the pixel 401. In the figure, wiring lines other than the signal lines connected to the source and drain of the connection transistors 324 and 325 are omitted.

In the pixel 401, the drain of the connection transistor 324 is connected to the drain of the P-type transistor 322 and the gate of the P-type transistor 323. Furthermore, the source of the connection transistor 325 is connected to the drain of the P-type transistor 322 and the gate of the P-type transistor 323. The drain of the connection transistor 325 in the pixel 401 is connected to the source of the connection transistor 324 in the pixel 402. The same applies to the pixels 402 and subsequent pixels.

Figure 19:
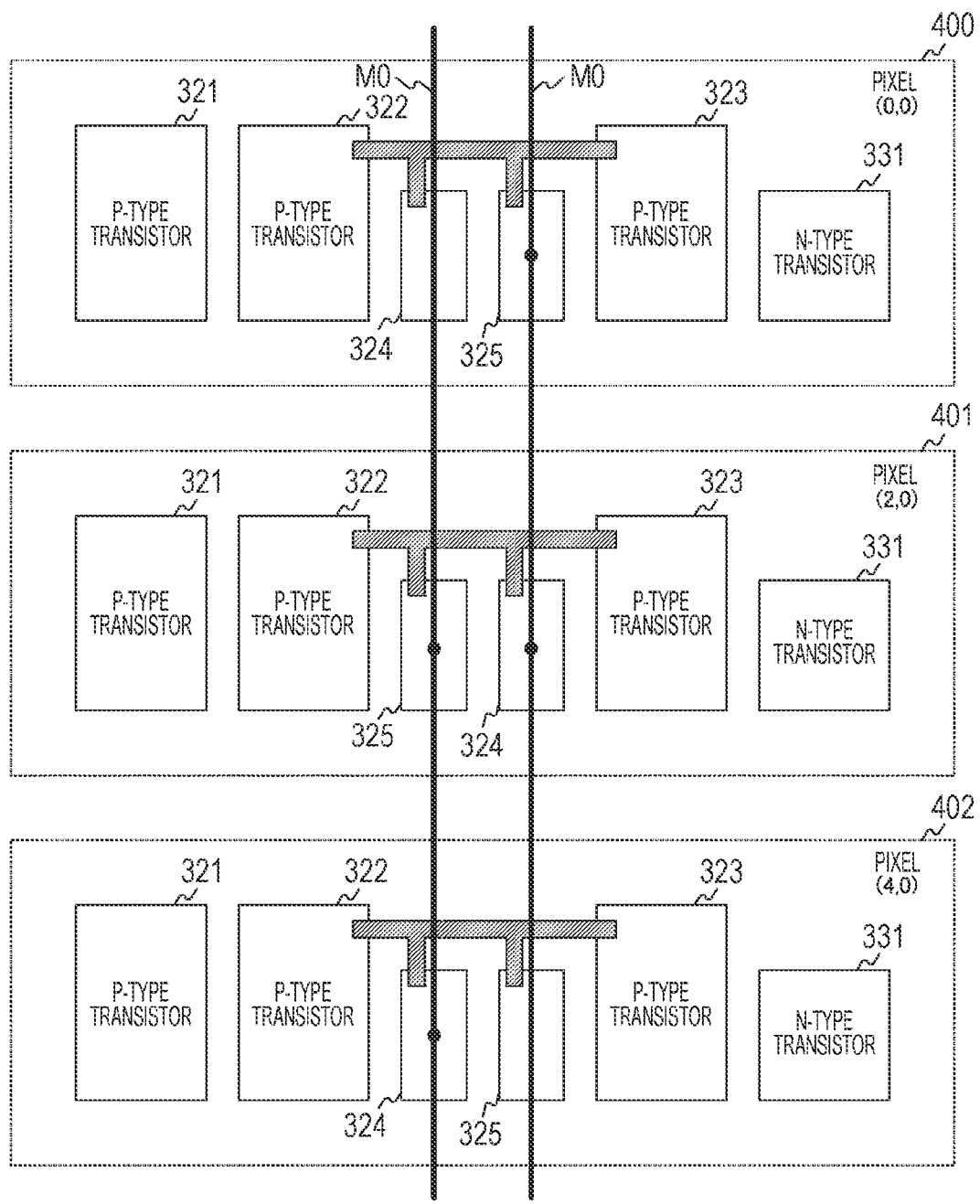
FIG. 19 is a diagram illustrating an example of wiring of a control line in the pixels in the second embodiment of the present technology.

FIG. 19 is a diagram illustrating an example of wiring of the control line M0 in the pixels in the second embodiment of the present technology. As illustrated in the figure, the control line M0 is wired in the vertical direction. The gate of each of the connection transistor 325 in the pixel 400, the connection transistors 324 and 325 in the pixel 401, and the connection transistor 324 in the pixel 402 is connected to the control line M0.

Note that, although the solid-state imaging element 200 adds three pixels together, the number of pixels to be added together is not limited to three, and four or more pixels can be added together. Furthermore, although the solid-state imaging element 200 adds a plurality of pixels of the same color adjacent to each other in the vertical direction together, it is also possible to add a plurality of pixels of the same color adjacent to each other in the horizontal direction together.

As described above, according to the second embodiment of the present technology, since the connection transistors 324 and 325 perform analog addition of the difference signals of the three pixels adjacent to each other in the vertical direction, more pixel data can be reduced than in a case where two pixels are added together.

3. Third Embodiment

In the second embodiment described above, three pixels adjacent to each other in the vertical direction are added together, but the number of pixels to be added together cannot be switched. The solid-state imaging element 200 of a third embodiment is different from the second embodiment in that the number of pixels to be added together is switched.

Figure 20:
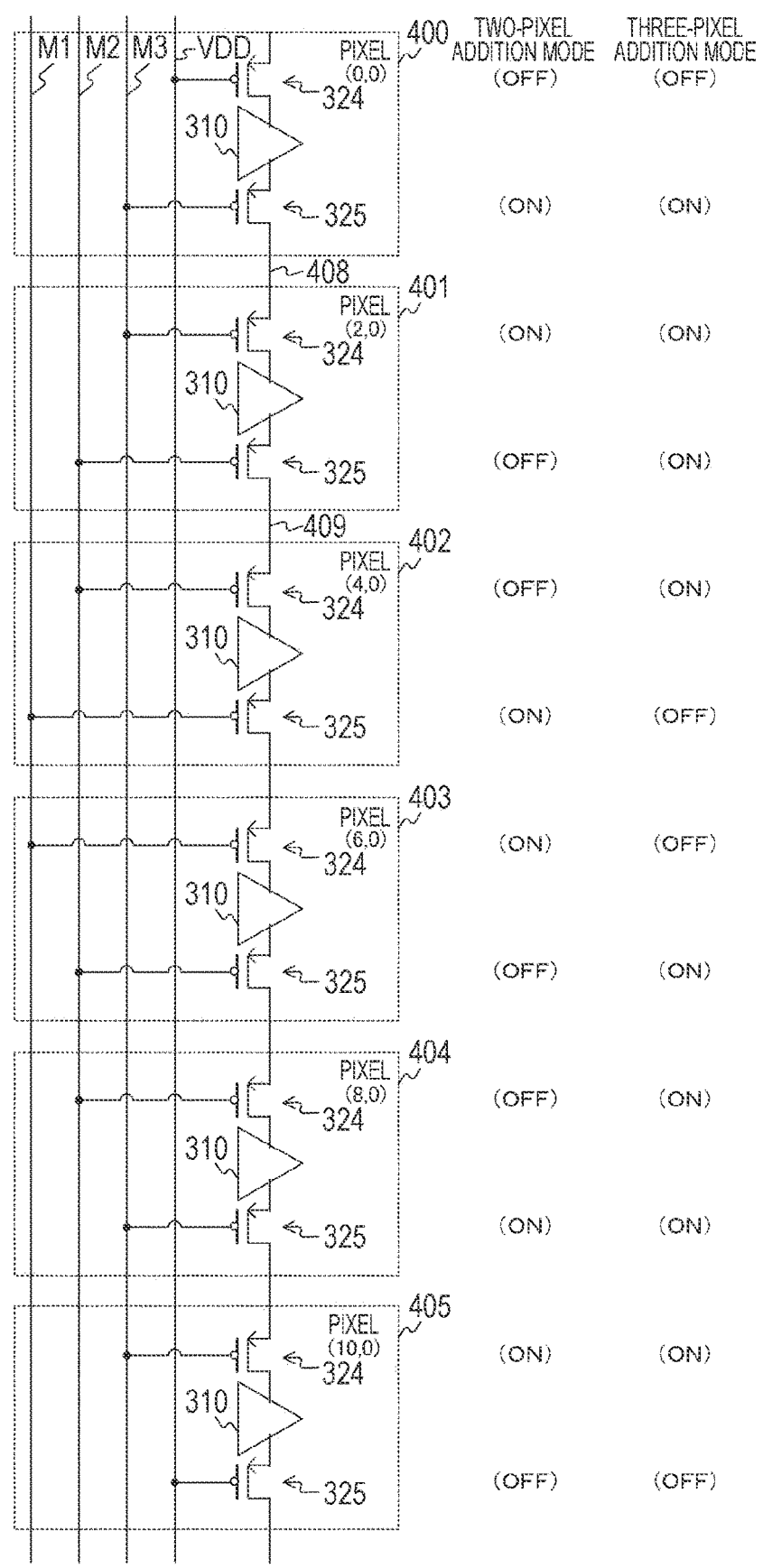
FIG. 20 is a diagram illustrating an example of a connection relationship of comparison units in a third embodiment of the present technology.

FIG. 20 is a diagram illustrating an example of a connection relationship of the comparison units 310 in the third embodiment of the present technology. Attention is paid to pixels 400, 401, 402, 403, 404, and 405 of the same color (R or the like) adjacent to each other in the vertical direction. The connection transistors 324 and 325 are arranged in each of the pixels 400 to 405 of the third embodiment, similarly to the second embodiment. Note that, in the figure, the pixel circuit 220 and the data storage unit 360 are omitted.

The gate of the connection transistor 324 in the pixel 400 is connected to the power supply line VDD, and the gate of the connection transistor 325 is connected to a control line M3. Furthermore, the gate of the connection transistor 324 in the pixel 401 is connected to the control line M3, and the gate of the connection transistor 325 is connected to a control line M2. The gate of the connection transistor 324 in the pixel 402 is connected to the control line M2, and the gate of the connection transistor 325 is connected to a control line M1.

The gate of the connection transistor 324 in the pixel 403 is connected to the control line M1, and the gate of the connection transistor 325 is connected to the control line M2. Furthermore, the gate of the connection transistor 324 in the pixel 404 is connected to the control line M2, and the gate of the connection transistor 325 is connected to the control line M3. The gate of the connection transistor 324 in the pixel 405 is connected to the control line M3, and the gate of the connection transistor 325 is connected to the power supply line VDD.

With a connection configuration described above, the connection transistor 325 in the pixel 400, the connection transistors 324 and 325 in the pixels 401 to 403, and the connection transistor 324 in the pixel 405 are turned on and off in accordance with control signals. On the other hand, the connection transistor 324 in the pixel 400 and the connection transistor 325 in the pixel 405 are always in the off state.

Furthermore, in the third embodiment, the pixel addition mode includes a two-pixel addition mode and a three-pixel addition mode. In the two-pixel addition mode, the connection transistor 325 in the pixel 400, the connection transistor 324 in the pixel 401, the connection transistor 325 in the pixel 402, and the connection transistor 324 in the pixel 403 are turned on. Furthermore, the connection transistor 325 in the pixel 404 and the connection transistor 324 in the pixel 405 are also turned on in accordance with a control signal. Other connection transistors are controlled to be in the off state. As a result, the pixels 400 and 401 are subjected to pixel addition. Furthermore, the pixels 402 and 403 are subjected to pixel addition, and the pixels 404 and 405 are subjected to pixel addition.

On the other hand, in the three-pixel addition mode, the connection transistor 325 in the pixel 400, the connection transistors 324 and 325 in the pixel 401, and the connection transistor 324 in the pixel 402 are turned on. Furthermore, the connection transistor 325 in the pixel 403, the connection transistors 324 and 325 in the pixel 404, and the connection transistor 324 in the pixel 405 are turned on. As a result, the pixels 400, 401, and 402 are subjected to pixel addition. Furthermore, the pixels 403, 404, and 405 are subjected to pixel addition.

Furthermore, in the non-addition mode, all the connection transistors 324 and 325 are controlled to be in the off state.

Note that, the pixels 400 and 403 are examples of a first pixel described in the claims, and the pixels 401 and 404 are examples of a second pixel described in the claims. The pixels 402 and 405 are examples of a third pixel described in the claims. Furthermore, the connection transistor 325 of the pixel 400 is an example of a second pixel side connection transistor described in the claims. The connection transistor 324 of the pixel 401 is an example of a first pixel side connection transistor described in the claims, and the connection transistor 325 of the pixel 401 is an example of a third pixel side connection transistor described in the claims. The connection transistor 324 of the pixel 402 is an example of the second pixel side connection transistor described in the claims.

Note that, the connection transistor 324 in the pixel 400 and the connection transistor 325 in the pixel 405 are always in the off state, but the configuration is not limited to this. The gates of these connection transistors can also be connected to a control line.

FIG. 21 is a diagram illustrating an example of control for each mode in the third embodiment of the present technology. In the two-pixel addition mode, a driver such as the V driver 261 supplies the low-level control signal via the control lines M1 and M3, and supplies the high-level control signal via the control line M2. In a case where P-type MOS transistors are used as the connection transistors 324 and 325, the transistors connected to the control lines M1 and M3 are turned on, and the transistors connected to the control line M2 are turned off, by this control. As a result, two pixels adjacent to each other such as pixels 400 and 401 are added together.

Furthermore, in the three-pixel addition mode, the driver supplies the high-level control signal via the control line M1, and supplies the low-level control signal via the control lines M2 and M3. By this control, the transistors connected to the control line M1 are turned off, and the transistors connected to the control lines M2 and M3 are turned on. As a result, three pixels adjacent to each other such as pixels 400, 401, and 403 are added together.

Figure 22:
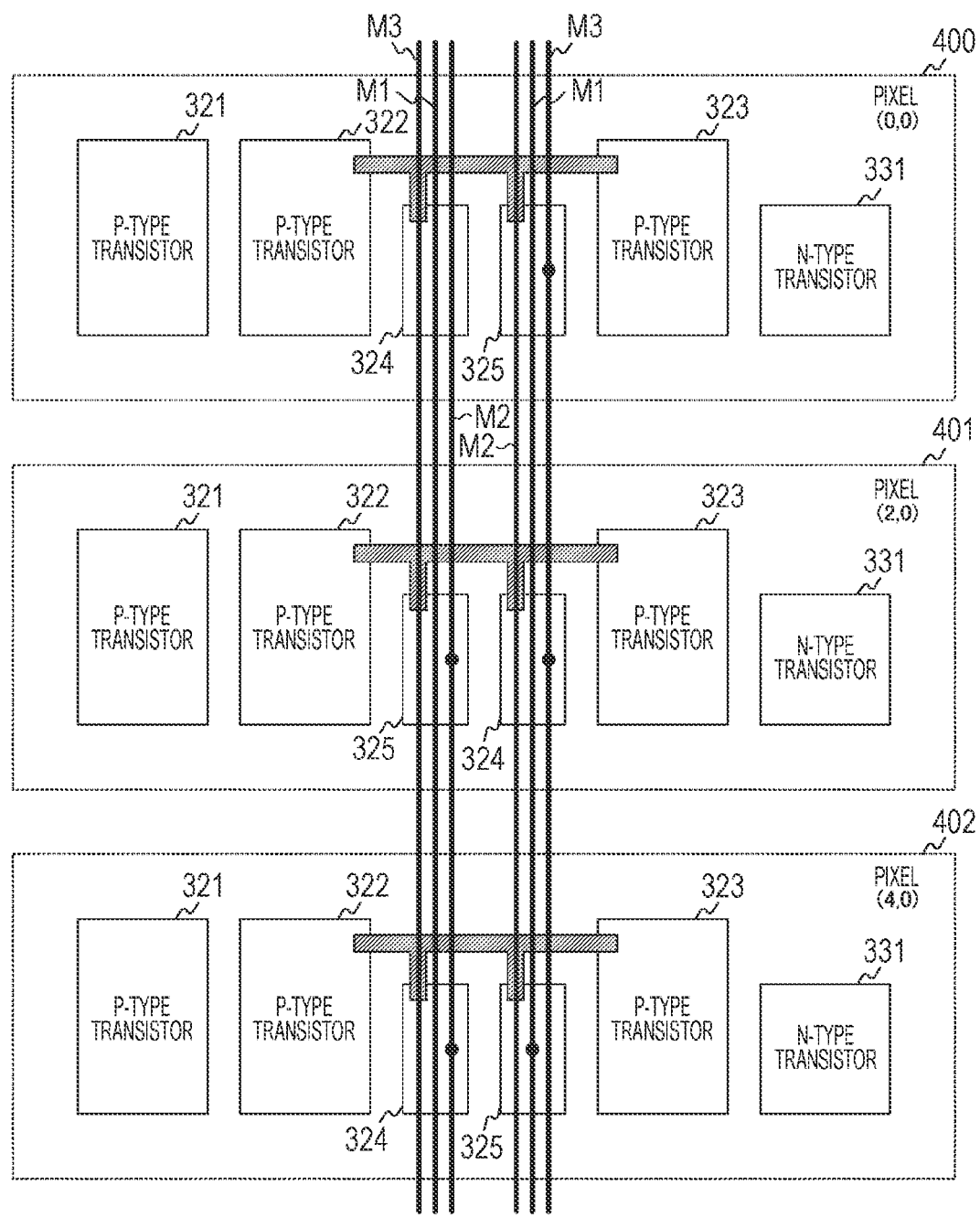
FIG. 22 is a diagram illustrating an example of wiring of control lines in the pixels in the third embodiment of the present technology.

FIG. 22 is a diagram illustrating an example of wiring of control lines M1, M2, and M3 in the pixels in the third embodiment of the present technology. As illustrated in the figure, the control lines M1, M2, and M3 are wired in the vertical direction. The gate of each of the connection transistor 325 in the pixel 400 and the connection transistor 324 in the pixel 401 is connected to the control line M3. The gate of each of the connection transistor 324 in the pixel 401 and the connection transistor 324 in the pixel 402 is connected to the control line M2. The gate of the connection transistor 325 in the pixel 402 is connected to the control line M1. In the figure, layouts of the pixels 403 to 405 are omitted. Furthermore, a connection configuration of the source and drain of the connection transistors 324 and 325 in the third embodiment is similar to that in the second embodiment illustrated in FIG. 18.

Note that, the solid-state imaging element 200 switches between the two-pixel addition mode and the three-pixel addition mode, but the configuration is not limited to this. By changing a control content, it is possible to change a combination of addition modes to be switched, such as switching between the three-pixel addition mode and a four-pixel addition mode. Furthermore, although the solid-state imaging element 200 adds a plurality of pixels of the same color adjacent to each other in the vertical direction together, it is also possible to add a plurality of pixels of the same color adjacent to each other in the horizontal direction together.

As described above, according to the third embodiment of the present technology, since the connection transistors 324 and 325 perform either addition of two adjacent pixels adjacent to each other or addition of three pixels adjacent to each other, the number of pixel data after the pixel addition can be controlled to either ½ or ⅓ before the addition.

Imaging Device (Scanning Type) According to Fourth Embodiment

An imaging device 20 according to the first embodiment described above is an asynchronous imaging device that reads an event by an asynchronous reading method. However, the event reading method is not limited to the asynchronous reading method, and may be a synchronous reading method. An imaging device to which the synchronous reading method is applied is a scanning type imaging device that is the same as a normal imaging device that performs imaging at a predetermined frame rate.

Figure 23:
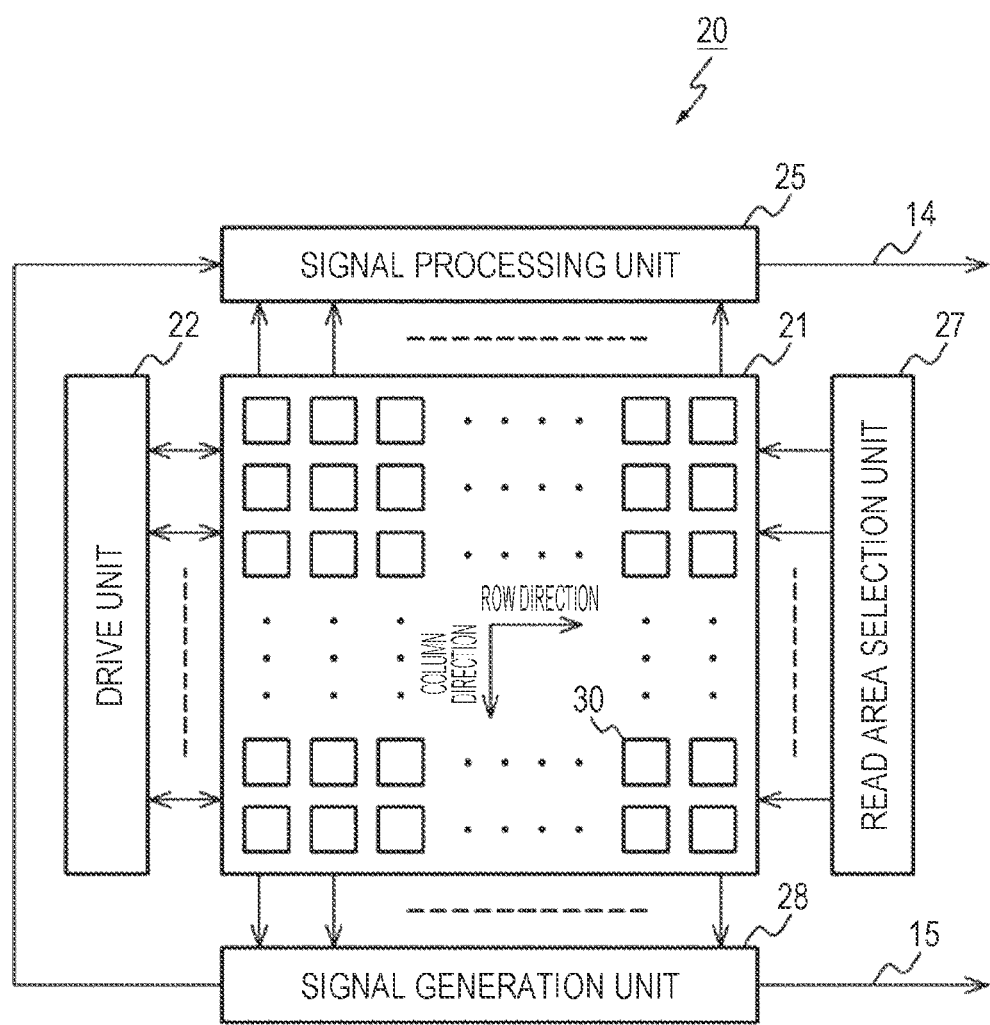
FIG. 23 is a block diagram illustrating an example of a configuration of an imaging device according to a fourth embodiment of the present technology.

FIG. 23 is a block diagram illustrating an example of a configuration of an imaging device according to a fourth embodiment used as the imaging device 20 in an imaging system 10 to which the technology according to the present disclosure is applied, that is, the scanning type imaging device.

As illustrated in FIG. 28, the imaging device 20 according to the fourth embodiment as an imaging device of the present disclosure includes a pixel array unit 21, a drive unit 22, a signal processing unit 25, a read area selection unit 27, and a signal generation unit 28.

The pixel array unit 21 includes a plurality of pixels 30. The plurality of pixels 30 outputs an output signal in response to a selection signal of the read area selection unit 27. A configuration of each of the plurality of pixels 30 is similar to that of the pixel 400 illustrated in FIG. 7. The plurality of pixels 30 outputs an output signal corresponding to an amount of change in light intensity. As illustrated in FIG. 23, the plurality of pixels 30 may be two-dimensionally arranged in a matrix.

The drive unit 22 drives each of the plurality of pixels 30 to output a pixel signal generated by each pixel 30 to the signal processing unit 25. Note that, the drive unit 22 and the signal processing unit 25 are circuit units for acquiring gradation information. Thus, in a case where only event information is acquired, the drive unit 22 and the signal processing unit 25 may be omitted.

The read area selection unit 27 selects some of the plurality of pixels 30 included in the pixel array unit 21. Specifically, the read area selection unit 27 determines a selection area in response to a request from each pixel 30 of the pixel array unit 21. For example, the read area selection unit 27 selects any one or a plurality of rows among rows included in a structure of a two-dimensional matrix corresponding to the pixel array unit 21. The read area selection unit 27 sequentially selects one or a plurality of rows depending on a preset period. Furthermore, the read area selection unit 27 may determine the selection area in response to the request from each pixel 30 of the pixel array unit 21.

The signal generation unit 28 generates an event signal corresponding to an active pixel in which an event is detected among selected pixels on the basis of the output signal of the pixel selected by the read area selection unit 27. The event is an event in which the intensity of light changes. The active pixel is a pixel in which the amount of change in light intensity corresponding to the output signal exceeds or falls below a preset threshold value. For example, the signal generation unit 28 compares the output signal of a pixel with a reference signal, detects an active pixel that outputs an output signal in a case where the output signal is larger or smaller than the reference signal, and generates an event signal corresponding to the active pixel.

The signal generation unit 28 may include, for example, a column selection circuit that arbitrates a signal entering the signal generation unit 28. Furthermore, the signal generation unit 28 may output not only information of the active pixel in which the event is detected but also information of an inactive pixel in which an event is not detected.

The signal generation unit 28 outputs address information and time stamp information (for example, (X, Y, T)) of the active pixel in which the event is detected through an output line 15. However, data output from the signal generation unit 28 may be not only the address information and the time stamp information but also frame format information (for example, (0, 0, 1, 0, . . . )).

5. Application Example to Mobile Body

The technology according to the present disclosure (the present technology) can be applied to various products. The technology according to the present disclosure may be implemented as a device mounted on any type of mobile body, for example, a car, an electric car, a hybrid electric car, a motorcycle, a bicycle, a personal mobility, an airplane, a drone, a ship, a robot, or the like.

Figure 24:
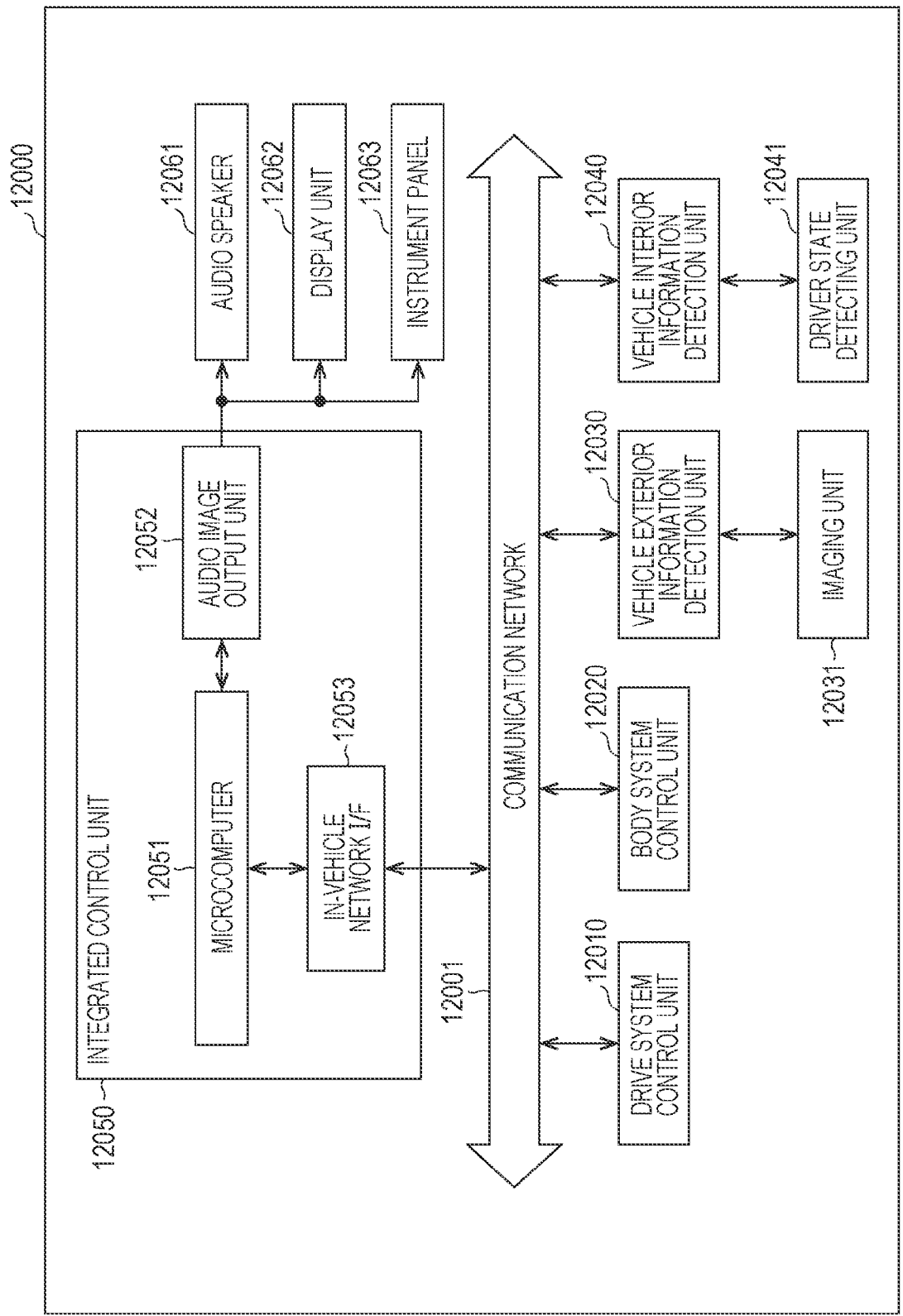
FIG. 24 is a block diagram illustrating a schematic configuration example of a vehicle control system.

FIG. 24 is a block diagram illustrating a schematic configuration example of a vehicle control system that is an example of a mobile body control system to which the technology according to the present disclosure can be applied.

The vehicle control system 12000 includes a plurality of electronic control units connected to each other via a communication network 12001. In the example illustrated in FIG. 24, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, an audio image output unit 12052, and an in-vehicle network interface (I/F) 12053 are illustrated.

The drive system control unit 12010 controls operation of devices related to a drive system of a vehicle in accordance with various programs. For example, the drive system control unit 12010 functions as a control device of a driving force generating device for generating driving force of the vehicle, such as an internal combustion engine or a driving motor, a driving force transmitting mechanism for transmitting driving force to wheels, a steering mechanism for adjusting a steering angle of the vehicle, a braking device for generating braking force of the vehicle, and the like.

The body system control unit 12020 controls operation of various devices equipped on the vehicle body in accordance with various programs. For example, the body system control unit 12020 functions as a control device of a keyless entry system, a smart key system, a power window device, or various lamps such as a head lamp, a back lamp, a brake lamp, a turn signal lamp, and a fog lamp. In this case, to the body system control unit 12020, a radio wave transmitted from a portable device that substitutes for a key, or signals of various switches can be input. The body system control unit 12020 accepts input of these radio waves or signals and controls a door lock device, power window device, lamp, and the like of the vehicle.

The vehicle exterior information detection unit 12030 detects information on the outside of the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image outside the vehicle and receives the image captured. The vehicle exterior information detection unit 12030 may perform object detection processing or distance detection processing on a person, a car, an obstacle, a sign, a character on a road surface, or the like, on the basis of the received image.

The imaging unit 12031 is an optical sensor that receives light and outputs an electric signal corresponding to an amount of light received. The imaging unit 12031 can output the electric signal as an image, or as distance measurement information. Furthermore, the light received by the imaging unit 12031 may be visible light, or invisible light such as infrared rays.

The vehicle interior information detection unit 12040 detects information on the inside of the vehicle. The vehicle interior information detection unit 12040 is connected to, for example, a driver state detecting unit 12041 that detects a state of a driver. The driver state detecting unit 12041 includes, for example, a camera that captures an image of the driver, and the vehicle interior information detection unit 12040 may calculate a degree of fatigue or a degree of concentration of the driver, or determine whether or not the driver is dozing, on the basis of the detection information input from the driver state detecting unit 12041.

The microcomputer 12051 can calculate a control target value of the driving force generating device, the steering mechanism, or the braking device on the basis of the information on the inside and outside of the vehicle acquired by the vehicle exterior information detection unit 12030 or the vehicle interior information detection unit 12040, and output a control command to the drive system control unit 12010. For example, the microcomputer 12051 can perform cooperative control aiming for implementing functions of advanced driver assistance system (ADAS) including collision avoidance or shock mitigation of the vehicle, follow-up traveling based on an inter-vehicle distance, vehicle speed maintaining traveling, vehicle collision warning, vehicle lane departure warning, or the like.

Furthermore, the microcomputer 12051 can perform cooperative control aiming for automatic driving that autonomously travels without depending on operation of the driver, or the like, by controlling the driving force generating device, the steering mechanism, the braking device, or the like on the basis of information on the periphery of the vehicle acquired by the vehicle exterior information detection unit 12030 or the vehicle interior information detection unit 12040.

Furthermore, the microcomputer 12051 can output a control command to the body system control unit 12020 on the basis of information on the outside of the vehicle acquired by the vehicle exterior information detection unit 12030. For example, the microcomputer 12051 can perform cooperative control aiming for preventing dazzling such as switching from the high beam to the low beam, by controlling the head lamp depending on a position of a preceding vehicle or an oncoming vehicle detected by the vehicle exterior information detection unit 12030.

The audio image output unit 12052 transmits at least one of audio or image output signal to an output device capable of visually or aurally notifying an occupant in the vehicle or the outside of the vehicle of information. In the example of FIG. 24, as the output device, an audio speaker 12061, a display unit 12062, and an instrument panel 12063 are exemplified. The display unit 12062 may include, for example, at least one of an on-board display or a head-up display.

Figure 25:
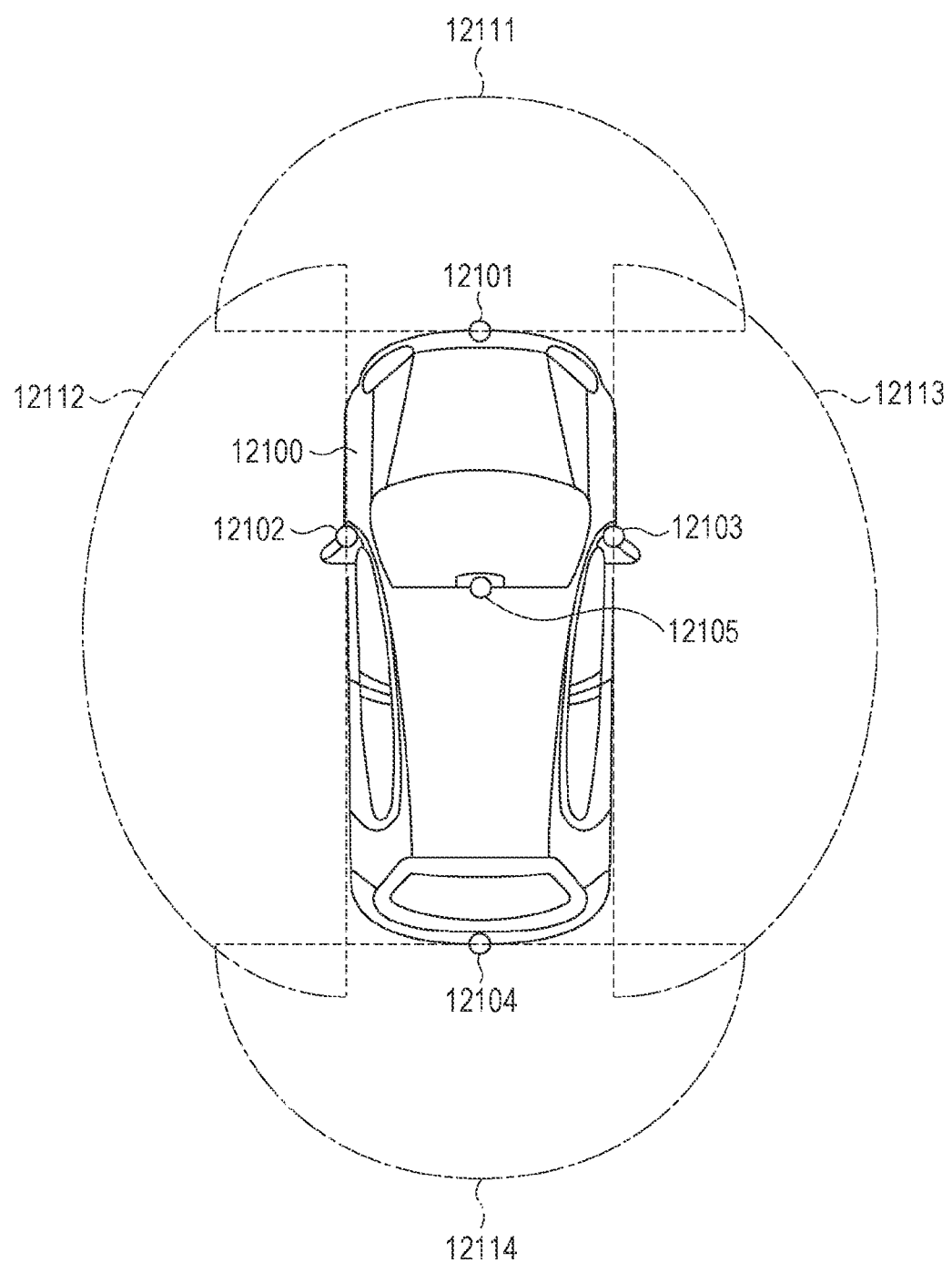
FIG. 25 is an explanatory diagram illustrating an example of an installation position of an imaging unit.

FIG. 25 is a diagram illustrating an example of installation positions of the imaging unit 12031.

In FIG. 25, as the imaging unit 12031, imaging units 12101, 12102, 12103, 12104, and 12105 are included.

The imaging units 12101, 12102, 12103, 12104, and 12105 are provided, for example, at a position of the front nose, the side mirror, the rear bumper, the back door, the upper part of the windshield in the vehicle interior, or the like, of a vehicle 12100. The imaging unit 12101 provided at the front nose and the imaging unit 12105 provided at the upper part of the windshield in the vehicle interior mainly acquire images ahead of the vehicle 12100. The imaging units 12102 and 12103 provided at the side mirrors mainly acquire images on the sides of the vehicle 12100. The imaging unit 12104 provided at the rear bumper or the back door mainly acquires an image behind the vehicle 12100. The imaging unit 12105 provided on the upper part of the windshield in the vehicle interior is mainly used for detecting a preceding vehicle, a pedestrian, an obstacle, a traffic signal, a traffic sign, a lane, or the like.

Note that, FIG. 25 illustrates an example of imaging ranges of the imaging units 12101 to 12104. An imaging range 12111 indicates an imaging range of the imaging unit 12101 provided at the front nose, imaging ranges 12112 and 12113 respectively indicate imaging ranges of the imaging units 12102 and 12103 provided at the side mirrors, an imaging range 12114 indicates an imaging range of the imaging unit 12104 provided at the rear bumper or the back door. For example, image data captured by the imaging units 12101 to 12104 are superimposed on each other, whereby an overhead image is obtained of the vehicle 12100 viewed from above.

At least one of the imaging units 12101 to 12104 may have a function of acquiring distance information. For example, at least one of the imaging units 12101 to 12104 may be a stereo camera including a plurality of imaging elements, or may be an imaging element including pixels for phase difference detection.

For example, on the basis of the distance information obtained from the imaging units 12101 to 12104, the microcomputer 12051 obtains a distance to each three-dimensional object within the imaging ranges 12111 to 12114, and a temporal change of the distance (relative speed to the vehicle 12100), thereby being able to extract, as a preceding vehicle, a three-dimensional object that is in particular a closest three-dimensional object on a traveling path of the vehicle 12100 and traveling at a predetermined speed (for example, greater than or equal to 0 km/h) in substantially the same direction as that of the vehicle 12100. Moreover, the microcomputer 12051 can set an inter-vehicle distance to be ensured in advance in front of the preceding vehicle, and can perform automatic brake control (including follow-up stop control), automatic acceleration control (including follow-up start control), and the like. As described above, it is possible to perform cooperative control aiming for automatic driving that autonomously travels without depending on operation of the driver, or the like.

For example, on the basis of the distance information obtained from the imaging units 12101 to 12104, the microcomputer 12051 can extract three-dimensional object data regarding the three-dimensional object by classifying the objects into a two-wheeled vehicle, a regular vehicle, a large vehicle, a pedestrian, and other three-dimensional objects such as a utility pole, and use the data for automatic avoidance of obstacles. For example, the microcomputer 12051 identifies obstacles in the periphery of the vehicle 12100 into an obstacle visually recognizable to the driver of the vehicle 12100 and an obstacle difficult to visually recognize. Then, the microcomputer 12051 determines a collision risk indicating a risk of collision with each obstacle, and when the collision risk is greater than or equal to a set value and there is a possibility of collision, the microcomputer 12051 outputs an alarm to the driver via the audio speaker 12061 and the display unit 12062, or performs forced deceleration or avoidance steering via the drive system control unit 12010, thereby being able to perform driving assistance for collision avoidance.

At least one of the imaging units 12101 to 12104 may be an infrared camera that detects infrared rays. For example, the microcomputer 12051 can recognize a pedestrian by determining whether or not a pedestrian exists in the captured images of the imaging units 12101 to 12104. Such pedestrian recognition is performed by, for example, a procedure of extracting feature points in the captured images of the imaging units 12101 to 12104 as infrared cameras, and a procedure of performing pattern matching processing on a series of feature points indicating a contour of an object to determine whether or not the object is a pedestrian. When the microcomputer 12051 determines that a pedestrian exists in the captured images of the imaging units 12101 to 12104 and recognizes the pedestrian, the audio image output unit 12052 controls the display unit 12062 so that a rectangular contour line for emphasis is superimposed and displayed on the recognized pedestrian. Furthermore, the audio image output unit 12052 may control the display unit 12062 so that an icon or the like indicating the pedestrian is displayed at a desired position.

In the above, an example has been described of the vehicle control system to which the technology according to the present disclosure can be applied. The technology according to the present disclosure can be applied to the imaging unit 12031 among the configurations described above. Specifically, for example, the imaging device 100 of FIG. 1 can be applied to the imaging unit 12031. By applying the technology according to the present disclosure to the imaging unit 12031, a more easily viewable captured image can be obtained at the time of pixel addition, so that driver's fatigue can be reduced.

Note that, the embodiments described above each describe an example for embodying the present technology, and matters in the embodiments and matters specifying the invention in the claims have correspondence relationships. Similarly, the matters specifying the invention in the claims and the matters in the embodiments of the present technology denoted by the same names have correspondence relationships. However, the present technology is not limited to the embodiments, and can be embodied by subjecting the embodiments to various modifications without departing from the gist thereof.

Furthermore, the processing procedures described in the embodiments described above may be regarded as a method having these series of procedures, and may be regarded as a program for causing a computer to execute these series of procedures or as a recording medium for storing the program. As the recording medium, for example, a Compact Disc (CD), MiniDisc (MD), Digital Versatile Disc (DVD), memory card, Blu-ray (registered trademark) Disc, or the like can be used.

Note that, the advantageous effects described in the specification are merely examples, and the advantageous effects of the present technology are not limited to them and may include other effects.

Note that, the present technology can also be configured as described below.

(1) A solid-state imaging element including a plurality of pixels each provided with:

a comparison unit that generates a difference signal obtained by amplifying a difference between an analog pixel signal to which a predetermined coordinate is assigned and a predetermined reference signal;

an addition circuit that generates an addition signal by performing analog addition of the difference signal and a difference signal regarding another coordinate adjacent to the predetermined coordinate; and a data storage unit that holds a digital signal indicating a time when a signal corresponding to the addition signal is inverted.

(2) The solid-state imaging element according to (1), in which the comparison unit generates and outputs the difference signal to a predetermined internal node, and the addition circuit performs analog addition of the difference signal by connection of the internal node of each of pixels to be added among the plurality of pixels.

(3) The solid-state imaging element according to (2), in which the pixels to be added are a pair of pixels, and the addition circuit includes a connection transistor that opens and closes a path between the internal node of one of the pair of pixels and the internal node of another.

(4) The solid-state imaging element according to (2), in which the pixels to be added are a first pixel, a second pixel, and a third pixel, the addition circuit of the second pixel includes a first pixel side connection transistor that opens and closes a path between the first pixel and the internal node of the second pixel, and a third pixel side connection transistor that opens and closes a path between the internal node of the second pixel and the third pixel.

(5) The solid-state imaging element according to (4), in which in a case where a two-pixel addition mode for adding two pixels together is set, one of the first pixel side connection transistor or the third pixel side connection transistor shifts to an open state and another shifts to a closed state, and in a case where a three-pixel addition mode for adding three pixels together is set, both the first pixel side connection transistor and the third pixel side connection transistor shift to the closed state.

(6) The solid-state imaging element according to (5), in which the addition circuit of each of the first pixel and the second pixel includes a second pixel side connection transistor that opens and closes a path between the internal node of the first pixel and the second pixel, and in a case where the two-pixel addition mode is set, the second pixel side connection transistor of one of the first pixel or the second pixel shifts to the open state and the second pixel-side connection transistor of another shifts to the closed state, and in a case where the three-pixel addition mode is set, the second pixel side connection transistor of both the first pixel and the second pixel shifts to the closed state.

(7) The solid-state imaging element according to any of (1) to (6), in which
the plurality of pixels is arranged in a two-dimensional lattice, and
the addition circuit performs analog addition of the difference signal of each of a predetermined number of pixels arranged in a predetermined direction among the plurality of pixels.

(8) The solid-state imaging element according to (7), in which
each of the plurality of pixels is provided with a repeater that transfers the digital signal,
the repeater is arranged in a vertical direction perpendicular to a predetermined horizontal direction, and
the addition circuit performs analog addition of the difference signal of each of the predetermined number of pixels arranged in the vertical direction.

(9) The solid-state imaging element according to (7), in which
each of the plurality of pixels is provided with a repeater that transfers the digital signal,
the repeater is arranged in a vertical direction perpendicular to a predetermined horizontal direction, and
the addition circuit performs analog addition of the difference signal of each of the predetermined number of pixels arranged in the horizontal direction among the plurality of pixels.

(10) The solid-state imaging element according to any of (1) to (9), in which
a part of the comparison unit is arranged on a predetermined light receiving chip, and
a rest of the comparison unit, the addition circuit, and the data storage unit are arranged on a predetermined circuit chip.

(11) An imaging device including:
a plurality of pixels each provided with a comparison unit that generates a difference signal obtained by amplifying a difference between an analog pixel signal to which a predetermined coordinate is assigned and a predetermined reference signal, an addition circuit that generates an addition signal by performing analog addition of the difference signal and a difference signal regarding another coordinate adjacent to the predetermined coordinate, and a data storage unit that holds a digital signal indicating a time when a signal corresponding to the addition signal is inverted; and
a logic circuit that processes the digital signal.

REFERENCE SIGNS LIST

100 Imaging device
110 Optical unit
120 DSP circuit
130 Display unit
140 Operation unit
150 Bus
160 Frame memory
170 Storage unit
180 Power supply unit
200 Solid-state imaging element
201 Light receiving chip
202 Circuit chip
210 Pixel area
211 Pixel block
220 Pixel circuit
221 Reset transistor
222 Floating diffusion layer
223 Transfer transistor
224 Photodiode
225 Discharge transistor
226, 227 Differential transistor
228 Current source transistor
231, 232, 261, 262 V driver
233, 263 H driver
234 DAC
250 AD conversion circuit area
264 Logic circuit
300 to 304 cluster
310 Comparison unit
320 differential input circuit
321, 322, 323, 341, 342, 344, 345 P-type transistor
324, 325 connection transistor
330 Voltage conversion circuit
331, 343, 346, 347 N-type transistor
340 Positive feedback circuit
360 Data storage unit
370 Time code transfer unit
371 Repeater
400 to 405 Pixel
12031 Imaging unit

The invention claimed is:
1. A solid-state imaging element, comprising:
a plurality of pixels each including:
a comparison unit configured to generate a difference signal obtained by amplifying a difference between an analog pixel signal to which a predetermined coordinate is assigned and a predetermined reference signal;
an addition circuit configured to generate an addition signal by performing analog addition of the difference signal and a difference signal regarding another coordinate adjacent to the predetermined coordinate; and
a data storage unit configured to hold a digital signal indicating a time when a signal corresponding to the addition signal is inverted.
2. The solid-state imaging element according to claim 1, wherein
the comparison unit is further configured to generate and output the difference signal to an internal node, and
the addition circuit is further configured to perform the analog addition of the difference signal by connection of the internal node of each of pixels to be added among the plurality of pixels.
3. The solid-state imaging element according to claim 2, wherein
the pixels to be added are a pair of pixels among the plurality of pixels, and
the addition circuit includes a connection transistor that is configured to open and close a path between the internal node of one of the pair of pixels and the internal node of another of the pair of pixels.
4. The solid-state imaging element according to claim 2, wherein
the pixels to be added include a first pixel, a second pixel, and a third pixel,
the addition circuit of the second pixel includes:
a first pixel side connection transistor that is configured to open and close a path between the first pixel and the internal node of the second pixel; and
a third pixel side connection transistor that is configured to open and close a path between the internal node of the second pixel and the third pixel.

5. The solid-state imaging element according to claim 4, wherein
in a case where a two-pixel addition mode for adding two pixels together is set, one of the first pixel side connection transistor or the third pixel side connection transistor shifts to an open state and another of the first pixel side connection transistor or the third pixel side connection transistor shifts to a closed state, and
in a case where a three-pixel addition mode for adding three pixels together is set, both the first pixel side connection transistor and the third pixel side connection transistor shift to the closed state.

6. The solid-state imaging element according to claim 5, wherein
the addition circuit of each of the first pixel and the second pixel includes a second pixel side connection transistor that is configured to open and close a path between the internal node of the first pixel and the second pixel,
in a case where the two-pixel addition mode is set, the second pixel side connection transistor of one of the first pixel or the second pixel shifts to the open state and the second pixel side connection transistor of another of the first pixel or the second pixel shifts to the closed state, and
in a case where the three-pixel addition mode is set, the second pixel side connection transistor of both the first pixel and the second pixel shifts to the closed state.

7. The solid-state imaging element according to claim 1, wherein
the plurality of pixels is arranged in a two-dimensional lattice, and
the addition circuit is further configured to perform the analog addition of the difference signal of each of a predetermined number of pixels arranged in a predetermined direction among the plurality of pixels.

8. The solid-state imaging element according to claim 7, wherein
each of the plurality of pixels comprises a repeater that transfers the digital signal,
the repeater is arranged in a vertical direction perpendicular to a predetermined horizontal direction, and
the addition circuit is further configured to perform the analog addition of the difference signal of each of the predetermined number of pixels arranged in the vertical direction.

9. The solid-state imaging element according to claim 7, wherein
each of the plurality of pixels is provided with a repeater that is configured to transfer the digital signal,
the repeater is arranged in a vertical direction perpendicular to a predetermined horizontal direction, and
the addition circuit is further configured to perform the analog addition of the difference signal of each of the predetermined number of pixels arranged in the predetermined horizontal direction among the plurality of pixels.

10. The solid-state imaging element according to claim 1, wherein
a part of the comparison unit is arranged on a predetermined light receiving chip, and
a rest of the comparison unit, the addition circuit, and the data storage unit are arranged on a predetermined circuit chip.

11. An imaging device comprising:
a plurality of pixels each including:
a comparison unit configured to generate a difference signal obtained by amplifying a difference between an analog pixel signal to which a predetermined coordinate is assigned and a predetermined reference signal;
an addition circuit configured to generate an addition signal by performing analog addition of the difference signal and a difference signal regarding another coordinate adjacent to the predetermined coordinate; and
a data storage unit configured to hold a digital signal indicating a time when a signal corresponding to the addition signal is inverted; and
a logic circuit configured to process the digital signal.

* * * * *